(12) United States Patent
Song et al.

(10) Patent No.: US 11,778,807 B2
(45) Date of Patent: Oct. 3, 2023

(54) SEMICONDUCTOR MEMORY DEVICE AND METHOD OF FABRICATING THE SAME

(71) Applicant: SAMSUNG ELECTRONICS CO., LTD., Suwon-si (KR)

(72) Inventors: Jungwoo Song, Hwaseong-si (KR); Kwangmin Kim, Hwaseong-si (KR); Jun Ho Lee, Hwaseong-si (KR); Hyuckjin Kang, Seoul (KR); Yong Kwan Kim, Yongin-si (KR); Sangyeon Han, Suwon-si (KR); Seguen Park, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 144 days.

(21) Appl. No.: 17/371,452

(22) Filed: Jul. 9, 2021

(65) Prior Publication Data
US 2021/0335790 A1    Oct. 28, 2021

Related U.S. Application Data

(63) Continuation of application No. 16/805,066, filed on Feb. 28, 2020, now Pat. No. 11,114,440, which is a
(Continued)

(30) Foreign Application Priority Data

Nov. 29, 2017    (KR) .................... 10-2017-0161929

(51) Int. Cl.
*H01L 29/06*    (2006.01)
*H10B 12/00*    (2023.01)
(Continued)

(52) U.S. Cl.
CPC ......... *H10B 12/30* (2023.02); *H01L 23/5329* (2013.01); *H01L 29/0649* (2013.01);
(Continued)

(58) Field of Classification Search
CPC ...................... H01L 27/10814; H10B 12/485
See application file for complete search history.

(56) References Cited

U.S. PATENT DOCUMENTS 8,697,525 B2    4/2014   Kim et al.
9,337,203 B2    5/2016   Hwang et al.
(Continued)

FOREIGN PATENT DOCUMENTS

CN    102543944    7/2012
CN    104900584    9/2015
(Continued)

*Primary Examiner* — Christopher A Johnson
(74) *Attorney, Agent, or Firm* — F. CHAU & ASSOCIATES, LLC

(57) ABSTRACT

Provided are a semiconductor memory device and a method of fabricating the same. The semiconductor memory device may include: a first impurity doped region and a second impurity doped region spaced apart from each other in a semiconductor substrate, a bit line electrically connected to the first impurity doped region and crossing over the semiconductor substrate, a storage node contact electrically connected to the second impurity doped region, a first spacer and a second spacer disposed between the bit line and the storage node contact, and an air gap region disposed between the first spacer and the second spacer. The first spacer may cover a sidewall of the bit line, and the second spacer may be adjacent to the storage node contact. A top end of the first spacer may have a height higher than a height of a top end of the second spacer.

20 Claims, 26 Drawing Sheets

Related U.S. Application Data continuation of application No. 16/108,786, filed on Aug. 22, 2018, now Pat. No. 10,665,592.

(51) Int. Cl.
    *H01L 23/532*      (2006.01)
    *H10B 61/00*      (2023.01)
    *H10B 63/00*      (2023.01)
    *H10N 59/00*      (2023.01)

(52) U.S. Cl.
    CPC ......... *H10B 12/315* (2023.02); *H10B 12/482* (2023.02); *H10B 12/485* (2023.02); *H10B 61/00* (2023.02); *H10B 63/00* (2023.02); *H10N 59/00* (2023.02)

(56) References Cited

U.S. PATENT DOCUMENTS

| | | | |
|---|---|---|---|
| 9,608,077 | B1 | 3/2017 | Kye et al. |
| 9,704,871 | B2 | 7/2017 | Wu |
| 9,847,278 | B2 | 12/2017 | Kim et al. |
| 10,396,083 | B2 | 8/2019 | Kim et al. |
| 10,665,592 | B2 | 5/2020 | Song et al. |
| 2014/0306351 | A1 | 10/2014 | Kim |
| 2015/0126013 | A1 | 5/2015 | Hwang et al. |
| 2016/0329337 | A1 | 11/2016 | Hwang et al. |
| 2017/0125283 | A1* | 5/2017 | Lee ................. H01L 23/535 |
| 2017/0154805 | A1 | 6/2017 | Kim et al. |
| 2017/0221755 | A1 | 8/2017 | Sim et al. |
| 2017/0271340 | A1* | 9/2017 | Kim ................. H01L 27/10855 |
| 2018/0337186 | A1* | 11/2018 | Chang ............... H01L 27/10885 |
| 2019/0164975 | A1 | 5/2019 | Song et al. |
| 2020/0203347 | A1 | 6/2020 | Song et al. |

FOREIGN PATENT DOCUMENTS

| | | |
|---|---|---|
| CN | 106816430 | 6/2017 |
| KR | 1020140124176 | 10/2014 |
| KR | 1020170025859 | 3/2017 |
| KR | 1020170028666 | 3/2017 |
| KR | 1020170062098 | 6/2017 |
| KR | 10-2017-0107626 | 9/2017 |

\* cited by examiner

SEMICONDUCTOR MEMORY DEVICE AND METHOD OF FABRICATING THE SAME

CROSS-REFERENCE TO RELATED APPLICATIONS

This U.S. nonprovisional application is a continuation of U.S. application Ser. No. 16/805,066, filed on Feb. 28, 2020, which is a continuation of U.S. application Ser. No. 16/108,786, filed on Aug. 22, 2018, now U.S. Pat. No. 10,665,592, issued May 26, 2020, which claims priority under 35 U.S.C. § 119 to Korean Patent Application No. 10-2017-0161929, filed on Nov. 29, 2017, in the Korean Intellectual Property Office, the disclosures of which are herein incorporated by reference in their entirety.

TECHNICAL FIELD

The present inventive concept relates to a semiconductor memory device and a method of fabricating the same.

DISCUSSION OF RELATED ART

Semiconductor devices have been widely used in electronic industry because of their small size, multi-functionality, and/or low fabrication cost. As the semiconductor devices become increasingly integrated with the advancement of the electronic industry, line widths of patterns of the semiconductor devices are being reduced for high integration thereof. However, since new exposure techniques and/or expensive exposure systems may be required for printing these fine patterns, to highly integrate the semiconductor devices may not be easy. Thus, various researches have recently been conducted for new integration techniques.

SUMMARY

Exemplary embodiments of the present inventive concept provide a semiconductor memory device having enhanced reliability, and also provide a method of fabricating the semiconductor memory device in which a process margin for landing pads is increased.

According to an exemplary embodiment of the present inventive concept, a semiconductor memory device may include: a first impurity doped region and a second impurity doped region spaced apart from each other in a semiconductor substrate; a bit line electrically connected to the first impurity doped region and crossing over the semiconductor substrate; a storage node contact electrically connected to the second impurity doped region; a first spacer and a second spacer disposed between the bit line and the storage node contact; and an air gap region disposed between the first spacer and the second spacer. The first spacer may cover a sidewall of the bit line, and the second spacer may be adjacent to the storage node contact. A top end of the first spacer may have a height higher than a height of a top end of the second spacer.

According to an exemplary embodiment of the present inventive concept, a semiconductor memory device may include: a bit line crossing over a semiconductor substrate; a bit line capping pattern on the bit line; a plurality of storage node contacts adjacent to a side of the bit line and arranged in a row along the bit line; a plurality of insulation fences adjacent to the side of the bit line and between the plurality of storage node contacts; and an air gap region between the bit line and the plurality of storage node contacts and between the bit line and the plurality of insulation fences. A top end of the air gap region may be higher than a top surface of the bit line.

According to an exemplary embodiment of the present inventive concept, a method of fabricating a semiconductor memory device may include: forming on a semiconductor substrate a bit line and a bit line capping pattern on the bit line; forming a first spacer, a sacrificial spacer, and a second spacer that sequentially cover a sidewall of the bit line capping pattern and a sidewall of the bit line; partially removing upper portions of the sacrificial spacer and the second spacer to expose a sidewall of the first spacer; forming a storage node contact adjacent to the second spacer; forming a conductive layer that covers the bit line capping pattern, the first spacer, the sacrificial spacer, the second spacer, and the storage node contact; etching the conductive layer to form a recess region exposing the sacrificial spacer and to form a landing pad electrically connected to the storage node contact; removing the sacrificial spacer to form an air gap region; and forming a buried dielectric pattern that fills the recess region and defines a top end of the air gap region.

BRIEF DESCRIPTION OF THE DRAWINGS

Exemplary embodiments of the present inventive concept will be more clearly understood from the following detailed description taken in conjunction with the accompanying drawings in which:

FIGS. 2A to 11A are plan views showing a method of fabricating a semiconductor memory device whose plan view is shown in FIG. 1A according to an exemplary embodiment of the present inventive concept;

FIGS. 2B to 11B are cross-sectional views, respectively, of FIG. 2A to 11A;

Figure 1A:
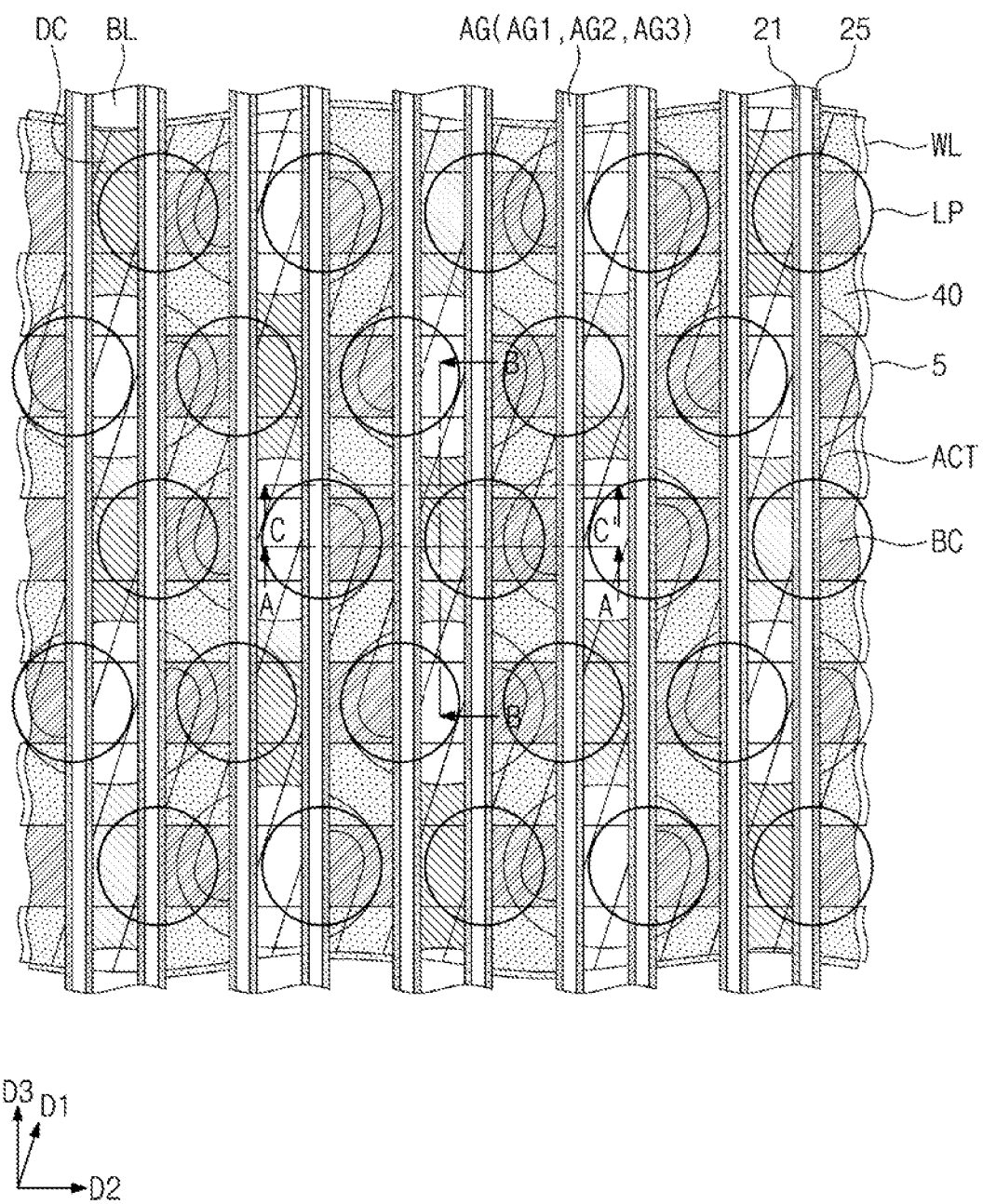
FIG. 1A is a plan view showing a semiconductor memory device according to an exemplary embodiment of the present inventive concept.

Since the drawings in FIGS. 1-13 are intended for illustrative purposes, the elements in the drawings are not necessarily drawn to scale. For example, some of the elements may be enlarged or exaggerated for clarity purpose.

DETAILED DESCRIPTION OF EMBODIMENTS

Hereinafter, some exemplary embodiments of the present inventive concept will be described in detail in conjunction with the accompanying drawings to aid in clearly explaining the present inventive concept.

Figure 1B:
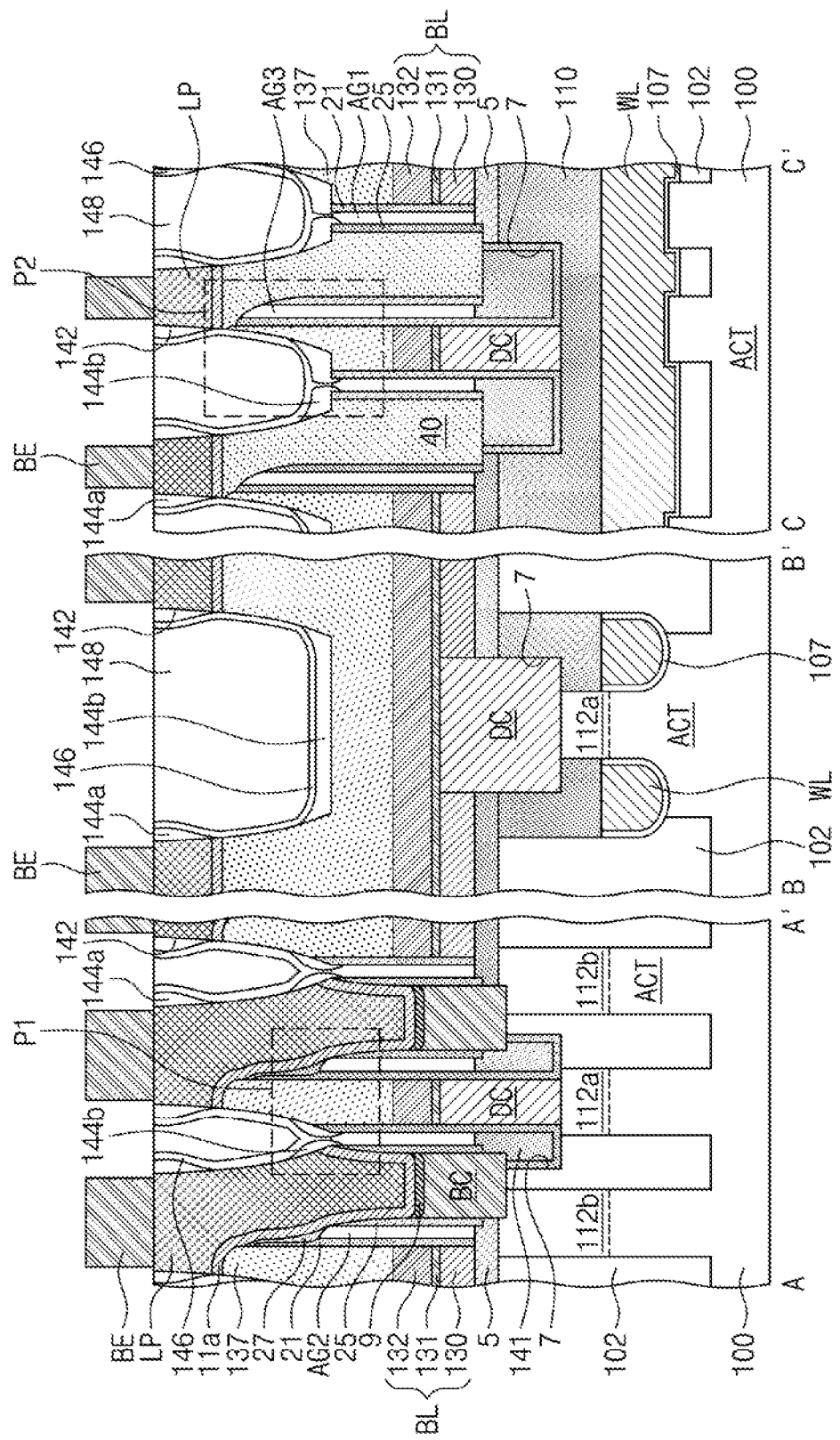
FIG. 1B is a partial cross-sectional view of FIG. 1A.
Figure 1C:
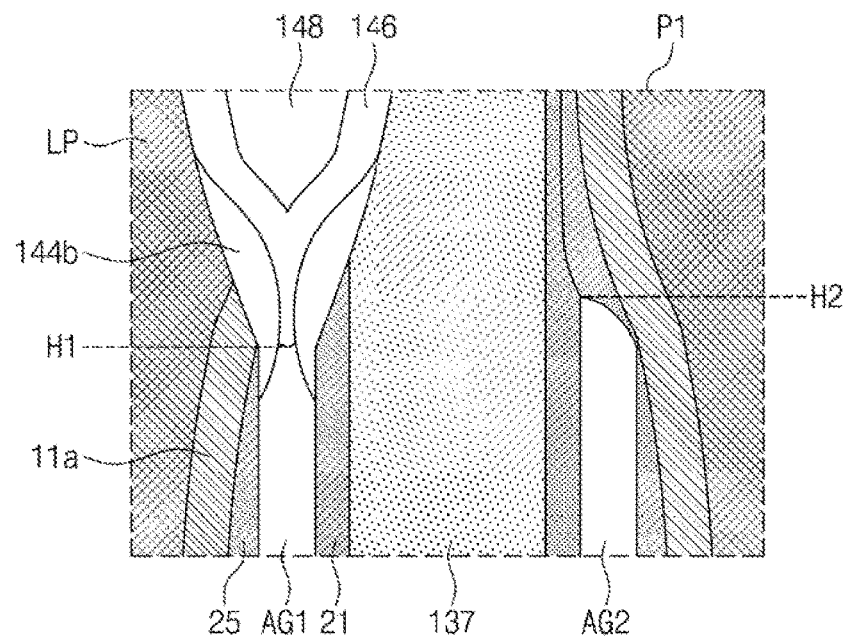
FIG. 1C is an enlarged view showing section P1 of FIG. 1B.
Figure 1D:
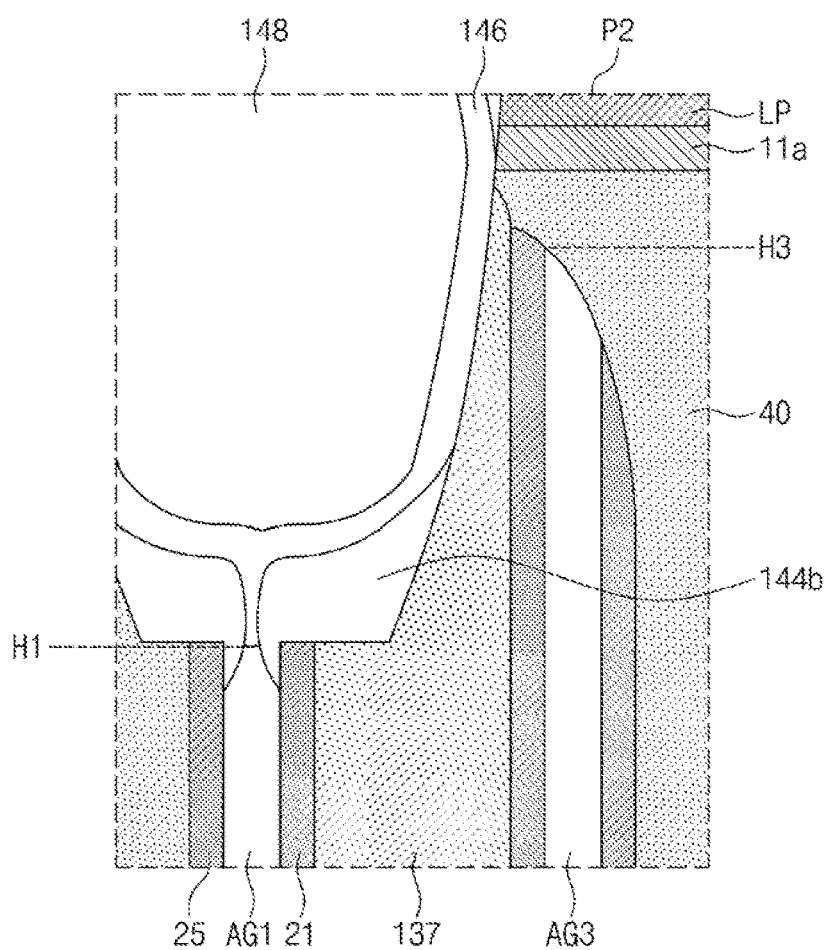
FIG. 1D is an enlarged view showing section P2 of FIG. 1B.

FIG. 1A is a plan view showing a semiconductor memory device according to an exemplary embodiment of the present inventive concept. FIG. 1B is a partial cross-sectional view of FIG. 1A. FIG. 1C is an enlarged view showing section P1 of FIG. 1B. FIG. 1D is an enlarged view showing section P2 of FIG. 1B. FIG. 1B shows cross-sections taken along lines A-A', B-B', and C-C' of FIG. 1A.

Referring to FIGS. 1A to 1D, a semiconductor substrate 100 (referred to hereinafter as a substrate) may be provided therein with device isolation patterns 102 defining active sections ACT. Each of the active sections ACT may have an isolated shape, and may have a bar shape elongated along a first direction D1 in a plan view. When viewed in plan, the active sections ACT may correspond to portions of the substrate 100 that are surrounded by the device isolation patterns 102. The substrate 100 may include a semiconductor material, and may include a group IV semiconductor and/or a III-V compound semiconductor. For example, the substrate 100 may be or include a silicon (Si) substrate, a germanium (Ge) substrate, or a silicon-germanium (SiGe) substrate, and may include multilayers such as, for example, a silicon-on-insulator (SOI) substrate, or a germanium-on-insulator (GOI) substrate. In addition, the substrate 100 may include one or more semiconductor layers or structures and may include active or operable portions of semiconductor devices. The device isolation patterns 102 may include, for example, an oxide (e.g., silicon oxide ($SiO_2$)), a nitride (e.g., silicon nitride ($Si_3N_4$)), or an oxynitride (e.g., silicon oxynitride (SiON)). The active sections ACT may be arranged in parallel to each other such that one of the active sections ACT may have an end portion adjacent to a central portion of a neighboring one of the active sections ACT.

Word lines WL may run across the active sections ACT, and may be disposed within grooves formed in the device isolation patterns 102 and the active sections ACT. The word lines WL may be parallel to a second direction D2 crossing the first direction D1, and may be formed of a conductive material. A gate dielectric layer 107 may be disposed between each of the word lines WL and an inner surface of each of the grooves. The grooves may have floors that are relatively deeper in the device isolation patterns 102 and relatively shallower in the active sections ACT. The gate dielectric layer 107 may include at least one of, for example, thermal oxide (e.g., silicon oxide ($SiO_2$)), silicon nitride ($Si_3N_4$), silicon oxynitride (SiON), and high-k dielectric. The high-k dielectric may have a dielectric constant greater than that of the silicon oxide ($SiO_2$). Each of the word lines WL may have a curved bottom surface. The bottom surface of the word line WL on the device isolation pattern 102 may be lower than the bottom surface of the word line WL on the active section ACT. The bottom surfaces of the word lines WL may correspond to the floors of the grooves formed in the device isolation patterns 102 and the active sections ACT.

In an exemplary embodiment of the present inventive concept, a pair of word lines WL may cross one active section ACT. A first doped region 112a may be disposed in the active section ACT between the pair of the word lines WL, and a pair of second doped regions 112b may be disposed in opposite edge portions of the active section ACT. As a result, the first and second doped regions 112a and 112b may be disposed on the opposite sides of the word line WL, respectively. The first and second doped regions 112a and 112b may be doped with, for example, N-type impurities. The first doped region 112a may correspond to a common drain region, and the second doped regions 112b may correspond to source regions. A top surface of the first doped region 112a may be lower than a top surface of the second doped region 112b. A transistor may be constituted by one of the word lines WL and its adjacent first and second doped regions 112a and 112b. As the word lines WL are disposed within the grooves, each of the word lines WL may be provided thereunder with a channel region whose length becomes increased within a limited planar area. Accordingly, the short channel effect and the like may be minimized.

The word lines WL may have top surfaces lower than those of the active sections ACT. A word line capping pattern 110 may be disposed on each of the word lines WL. The word line capping patterns 110 may have linear shapes extending along longitudinal directions of the word lines WL, and may cover entire top surfaces of the word lines WL. The grooves may have inner spaces not occupied by the word lines WL, and the word line capping patterns 110 may fill the unoccupied inner spaces of the grooves. The word line capping patterns 110 may be formed of, for example, a silicon nitride ($Si_3N_4$) layer.

An interlayer dielectric pattern 5 may be disposed on the substrate 100, and may be formed as a single layer or multiple layers including at least one of, for example, a silicon oxide ($SiO_2$) layer, a silicon nitride ($Si_3N_4$) layer, and a silicon oxynitride (SiON) layer. The interlayer dielectric pattern 5 may be formed to have island shapes spaced apart from each other in a plan view, and may be formed to simultaneously cover end portions of two neighboring active sections ACT.

Top portion of the substrate 100, the device isolation pattern 102, and the word line capping pattern 110 may be partially recessed to form a first recess region 7. The first recess region 7 may have a net or mesh shape when viewed in plan as shown in FIG. 1A, and may have a sidewall aligned with that of the interlayer dielectric pattern 5.

Bit lines BL may be disposed on the interlayer dielectric pattern 5, and may cross over the word line capping patterns 110 and the word lines WL. As disclosed in FIG. 1A, the bit lines BL may be parallel to a third direction D3 crossing the first and second directions D1 and D2. The second direction D2 may be substantially perpendicular to the third direction D3. As shown in FIG. 1A, the first direction D1 may be inclined by a predetermined angle with respect to the second direction D2 or the third direction D3. The predetermined angle may vary to some degree. In an exemplary embodiment of the present inventive concept, the predetermined angle may range from about 10° to about 80°. Each of the bit lines BL may include a bit line polysilicon pattern 130, a bit line ohmic pattern 131, and a bit line metal-containing pattern 132 that are sequentially stacked. The bit line polysilicon pattern 130 may include impurity-doped polysilicon or impurity-undoped polysilicon. The bit line ohmic pattern 131 may include a metal silicide layer such as, for example, a cobalt silicide ($CoSi_2$) layer. The bit line metal-containing pattern 132 may include at least one of, for example, a metal (e.g., tungsten (W), titanium (Ti), tantalum (Ta), etc.) and a conductive metal nitride (e.g., titanium nitride (TiN), tantalum nitride (TaN), tungsten nitride (WN), etc.). A bit line capping pattern 137 may be disposed on each of the bit lines BL, and may be formed of an insulating material. For example, the bit line capping patterns 137 may include a nitride (e.g., silicon nitride ($Si_3N_4$)) or an oxynitride (e.g., silicon oxynitride (SiON)).

Bit line contacts DC may be disposed in the first recess region 7 intersecting the bit lines BL, and may include impurity-doped polysilicon or impurity-undoped polysilicon. When viewed in cross-section taken along line B-B' as shown in FIG. 1B, the bit line contact DC may have a sidewall in contact with that of the interlayer dielectric pattern 5. When viewed in plan as shown in FIG. 1A, the bit line contact DC may have a concave side surface in contact with the interlayer dielectric pattern 5. The bit line contact DC may electrically connect the first doped region 112a and the bit line BL to each other.

The first recess region 7 may have an empty space not occupied by the bit line contact DC, and a lower buried dielectric pattern 141 may occupy the empty space of the first recess region 7. The lower buried dielectric pattern 141 may be formed as a single layer or multiple layers including at least one of, for example, a silicon oxide ($SiO_2$) layer, a silicon nitride ($Si_3N_4$) layer, and a silicon oxynitride (SiON) layer.

Storage node contacts BC may be disposed between a pair of neighboring bit lines BL in a plan view, and may be spaced apart from each other. The storage node contacts BC may include impurity-doped polysilicon or impurity-undoped polysilicon. Each of the storage node contacts BC may have a concave top surface. An insulation fence 40 may be disposed between the storage node contacts BC and between the bit lines BL, and may be formed of an insulating layer such as, for example, a silicon oxide ($SiO_2$) layer, a silicon nitride ($Si_3N_4$) layer, or a silicon oxynitride (SiON) layer. One bit line BL may be provided on its one side with the storage node contacts BC and the insulation fences 40 that are disposed alternately and repeatedly along the bit line BL. The insulation fence 40 may have a top end whose height (or level) is higher than that of a top end of each of the storage node contacts BC.

A first spacer 21 and a second spacer 25 may be interposed between the bit line BL and the storage node contact BC. The first spacer 21 may cover a sidewall of the bit line BL and a sidewall of the bit line capping pattern 137. The second spacer 25 may be adjacent to the storage node contact BC. The first spacer 21 and the second spacer 25 may include the same material. For example, the first spacer 21 and the second spacer 25 may include a silicon nitride ($Si_3N_4$) layer. The first spacer 21 may be spaced apart from the second spacer 25. An air gap region AG may be disposed between the first spacer 21 and the second spacer 25. The first spacer 21, the air gap region AG, and the second spacer 25 may extend along a side surface of the bit line BL, thereby being interposed between the bit line BL and the insulation fence 40. The air gap region AG may have a top end whose height (or level) is higher than that of a top surface of the bit line BL. The second spacer 25 may have a top end whose height (or level) is lower than that of a top end of the first spacer 21. Such a configuration may increase a process margin for landing pads LP which will be discussed below. For example, in an etching process of forming the landing pad LP, the above described configuration may allow an etchant supply to be controlled to suppress sidewalls of the landing pad LP from being etched, thereby preventing a width of the landing pad LP being reduced. As a result, disconnection between the landing pad LP and the storage node contact BC may be prevented. The first spacer 21 may extend to cover a sidewall of the bit line contact DC and a sidewall and a floor surface of the first recess region 7. For example, the first spacer 21 may be interposed between the bit line contact DC and the lower buried dielectric layer 141, between the word line capping pattern 110 and the lower buried dielectric pattern 141, between the substrate 100 and the lower buried dielectric pattern 141, and between the device isolation pattern 102 and the lower buried dielectric pattern 141.

A storage node ohmic layer 9 may be disposed on the storage node contact BC, and may include metal silicide such as, for example, cobalt silicide ($CoSi_2$). The storage node ohmic layer 9, the first and second spacers 21 and 25, and the bit line capping pattern 137 may be conformally covered with a diffusion stop pattern 11a. The diffusion stop pattern 11a may include a metal nitride layer such as, for example, a titanium nitride (TiN) layer or a tantalum nitride (TaN) layer. A landing pad LP may be disposed on the diffusion stop pattern 11a, and may be formed of a material that contains a metal such as, for example, tungsten (W). The landing pad LP may have an upper portion that covers a top surface of the bit line capping pattern 137 and has a width greater than that of the storage node contact BC. A center of the landing pad LP may shift in the second direction D2 away from a center of the storage node contact BC. A portion of the bit line BL may vertically overlap the landing pad LP. For example, the landing pad LP may vertically overlap a side wall of the bit line BL.

A second recess region 142 may be provided on the bit line capping pattern 137, and may have a floor surface spaced apart from the bit line BL. The second recess region 142 may have a side surface that extends upward to expose a side surface of the diffusion stop pattern 11a and a side surface of the landing pad LP. For example, the side surface of the landing pad LP and the side surface of the diffusion stop pattern 11a may constitute a portion of the side surface of the second recess region 142. That is, at least a part of the sidewall of the second recess region 142 may be shared by the landing pad LP, and the floor surface of the second recess region 142 may be adjacent to the air gap region AG. The second recess region 142 may separate the landing pads LP from each other both in the second direction D2 and in the third direction D3.

The second recess region 142 may be provided therein with upper buried dielectric patterns 144a, 144b, 146, and 148. The upper buried dielectric patterns 144a, 144b, 146, and 148 may include a first upper buried dielectric pattern 144a that covers a sidewall of the landing pad LP or an upper sidewall of the second recess region 142, a second upper buried dielectric pattern 144b that covers the floor surface of the second recess region 142 and is spaced apart from the first upper buried dielectric pattern 144a, a third upper buried dielectric pattern 146 that is in contact with the first and second upper buried dielectric patterns 144a and 144b and an intermediate sidewall of the second recess region 142, and a fourth upper buried dielectric pattern 148 that fills the second recess region 142. The first and second upper buried dielectric patterns 144a and 144b may have the same density. The third upper buried dielectric pattern 146 may have a density greater than those of the first and second upper buried dielectric patterns 144a and 144b and less than that of the fourth upper buried dielectric pattern 148. The upper buried dielectric patterns 144a, 144b, 146, and 148 may include at least one of, for example, a silicon nitride ($Si_3N_4$) layer and a silicon carbonitride (SiCN) layer. For example, the first, second, and third upper buried dielectric patterns 144a, 144b, and 146 may each be formed of a silicon carbonitride (SiCN) layer, and the fourth upper buried dielectric pattern 148 may be formed of a silicon nitride ($Si_3N_4$) layer. The third upper buried dielectric pattern 146 may have a carbon content less than those of the first and second upper buried dielectric patterns 144a and 144b. The first and second upper buried dielectric patterns 144a and 144b may have the same carbon content. In general, addition of the carbon content to the silicon carbonitride (SiCN) layers causes decrease in the density of the silicon carbonitride (SiCN) layers, as well as decrease in hardness and transparency.

The air gap region AG may include a first air gap region AG1, a second air gap region AG2, and a third air gap region AG3. The second air gap region AG2 may vertically overlap the landing pad LP between the bit line BL and the storage node contact BC, and may have a top end that is limited or defined by a third spacer 27. The first air gap region AG1 may not vertically overlap the landing pad LP between the bit line BL and the storage node contact BC, and may have a top end adjacent to the floor surface of the second recess region 142. The top end of the first air gap region AG1 may be limited or defined by the third upper buried dielectric pattern 146. The third air gap region AG3 may vertically overlap the landing pad LP between the bit line BL and the insulation fence 40. When viewed in cross-section taken along line C-C' as shown in FIG. 1B, the third air gap region AG3 may have a top end limited or defined by the insulation fence 40. The bit line BL may include a first sidewall vertically overlapping the landing pad LP, and a second sidewall not vertically overlapping the landing pad LP, in which the second air gap region AG2 may be adjacent to the first sidewall of the bit line BL, and the first air gap region AG1 may be adjacent to the second sidewall of the bit line BL.

Referring to FIGS. 1C and 1D, the top end of the first air gap region AG1 may have a first height H1. The top end of the second air gap region AG2 may have a second height H2. The top end of the third air gap region AG3 may have a third height H3. The second height H2 may be higher than the first height H1 and lower than the third height H3.

A conductive pattern BE may be disposed on the landing pad LP. The conductive pattern BE may correspond either to a bottom electrode of a capacitor or to a contact plug connected to the bottom electrode. Alternatively, the conductive pattern BE may correspond either to a contact plug or to a bottom electrode electrically connected to one of, for example, a phase change material pattern, a variable resistance material pattern, and a magnetic tunnel junction pattern.

According to an exemplary embodiment of the present inventive concept, as the air gap region AG is filled with air whose dielectric constant is less than that of silicon oxide ($SiO_2$), a semiconductor memory device may decrease in parasitic capacitance between the bit line BL and the storage node contact BC. Moreover, as the air gap region AG is disposed between the bit line BL and the insulation fence 40, capacitance distribution of the bit line BL may be reduced. Accordingly, the semiconductor memory device according to the present exemplary embodiment may have superior reliability. In addition, since the parasitic capacitance is reduced, the storage node contacts BC may be spaced apart from the bit lines BL at reduced intervals such that the semiconductor memory device may be optimized for high integration.

FIGS. 2A to 11A are plan views showing a method of fabricating a semiconductor memory device whose plan view is shown in FIG. 1A. FIGS. 2B to 11B are cross-sectional views of FIG. 2A to 11A, respectively. FIG. 11C is a cross-sectional view taken along line D-D' of FIG. 11A. Each of FIGS. 2B to 11B shows cross-sections taken along lines A-A', B-B', and C-C' of a respective one of FIGS. 2A to 11A.

Figure 2A:
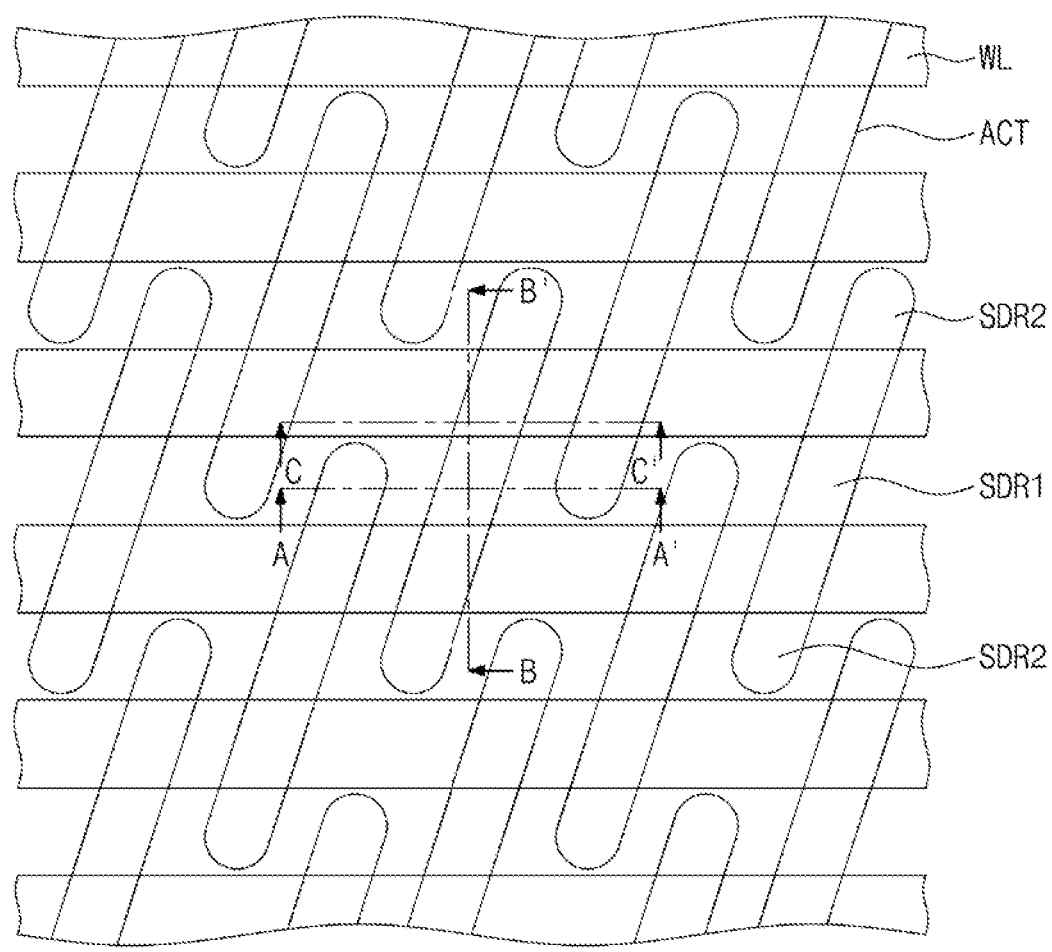
Figure 2B:
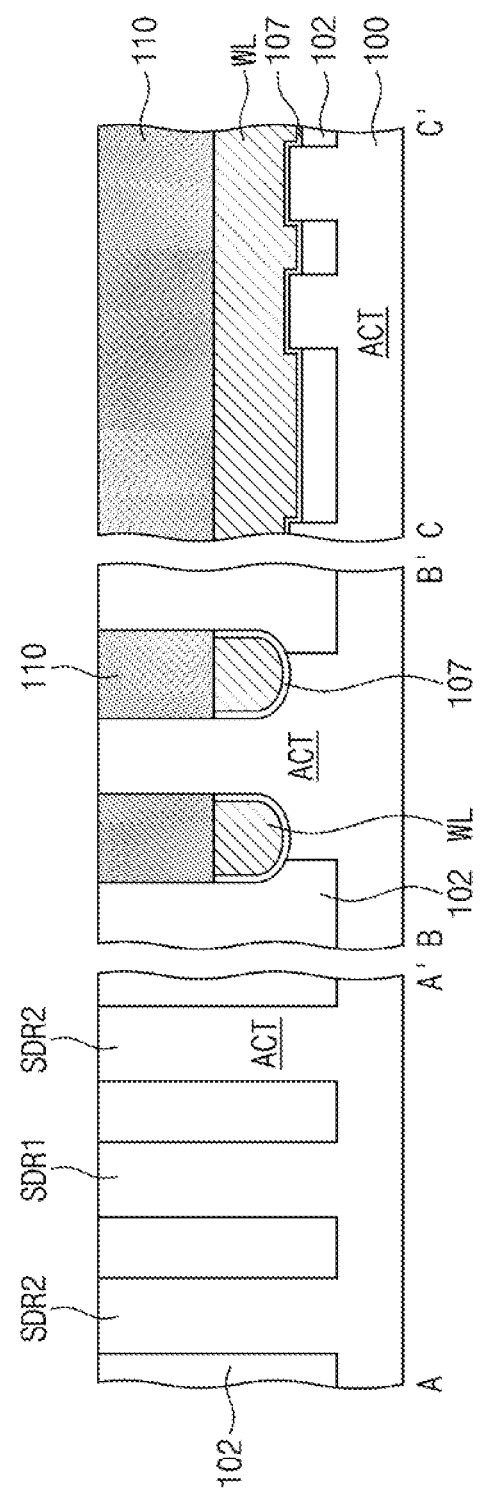

Referring to FIGS. 2A and 2B, device isolation patterns 102 may be formed in a substrate 100 to define active sections ACT. Device isolation trenches may be formed in the substrate 100, and the device isolation patterns 102 may fill the device isolation trench. For example, the device isolation patterns 102 and the active sections ACT may be formed by a shallow trench isolation (STI) process. In an exemplary embodiment of the present inventive concept, the device isolation trenches may be formed by removing an upper portion of the substrate 100 through an anisotropic etching process, and then an insulating film may be sufficiently provided to fill the device isolation trenches. Next, the device isolation patterns 102 may be formed by planarizing a top surface of the insulating film using a chemical mechanical planarization (CMP) process or the like until top surfaces of the active sections ACT are exposed. The device isolation patterns 102 may be formed of at least one of, for example, a silicon oxide ($SiO_2$) layer, a silicon nitride ($Si_3N_4$) layer, and a silicon oxynitride (SiON) layer. When viewed in plan, the active sections ACT may be arranged in parallel to each other in a first direction D1, and may be arranged in such a way that one of the active sections ACT may have an end portion adjacent to a central portion of a neighboring one of the active sections ACT. The active sections ACT and the device isolation patterns 102 may be patterned to form grooves. When the grooves are formed, an etching condition of the substrate 100 and the device isolation patterns 102 may be properly controlled such that the device isolation patterns 102 may be more easily etched than the substrate 100. Therefore, the grooves may have uneven floor surfaces. For example, the floor surfaces of the grooves may be deeper on the device isolation patterns 102 and shallower on the substrate 100.

Word lines WL may be formed in corresponding grooves, respectively. The bottom surfaces of the word lines WL may correspond to the floors of the grooves formed in the device isolation patterns 102 and the active sections ACT, and thus the bottom surface of the word line WL on the device isolation pattern 102 may be lower than the bottom surface of the word line WL on the active section ACT. A pair of word lines WL may run across each of the active sections ACT. As disclosed in FIG. 1A, the pair of word lines WL may divide each of the active sections ACT into a first source/drain region SDR1 and a pair of second source/drain regions SDR2. The first source/drain region SDR1 may be defined between the pair of word lines WL, and the pair of second source/drain regions SDR2 may be defined on opposite edges of each of the active sections ACT.

Before the word lines WL are formed, a gate dielectric layer 107 may be formed on an inner surface of each of the grooves. The gate dielectric layer 107 may be formed by, for example, a thermal oxidation process, a chemical vapor deposition (CVD) process, and/or an atomic layer deposition (ALD) process. The gate dielectric layer 107 may be formed of, for example, a silicon oxide ($SiO_2$) layer, a silicon nitride ($Si_3N_4$) layer, and/or a high-k dielectric layer such as a metal oxide layer. A gate conductive layer may be formed to fill the grooves, and then etched-back to form the word lines WL. The gate conductive layer may be formed of, for example, impurity-doped polysilicon, metal nitride, and/or metal. The word lines WL may be recessed to have top surfaces lower than those of the active sections ACT. The word lines WL may be formed to extend in a second direction D2 crossing the first direction D1. An insulation layer such as, for example, a silicon nitride ($Si_3N_4$) layer may be formed on the substrate 100 so as to fill the grooves, and then etched to form a word line capping pattern 110 on each of the word lines WL.

Figure 3A:
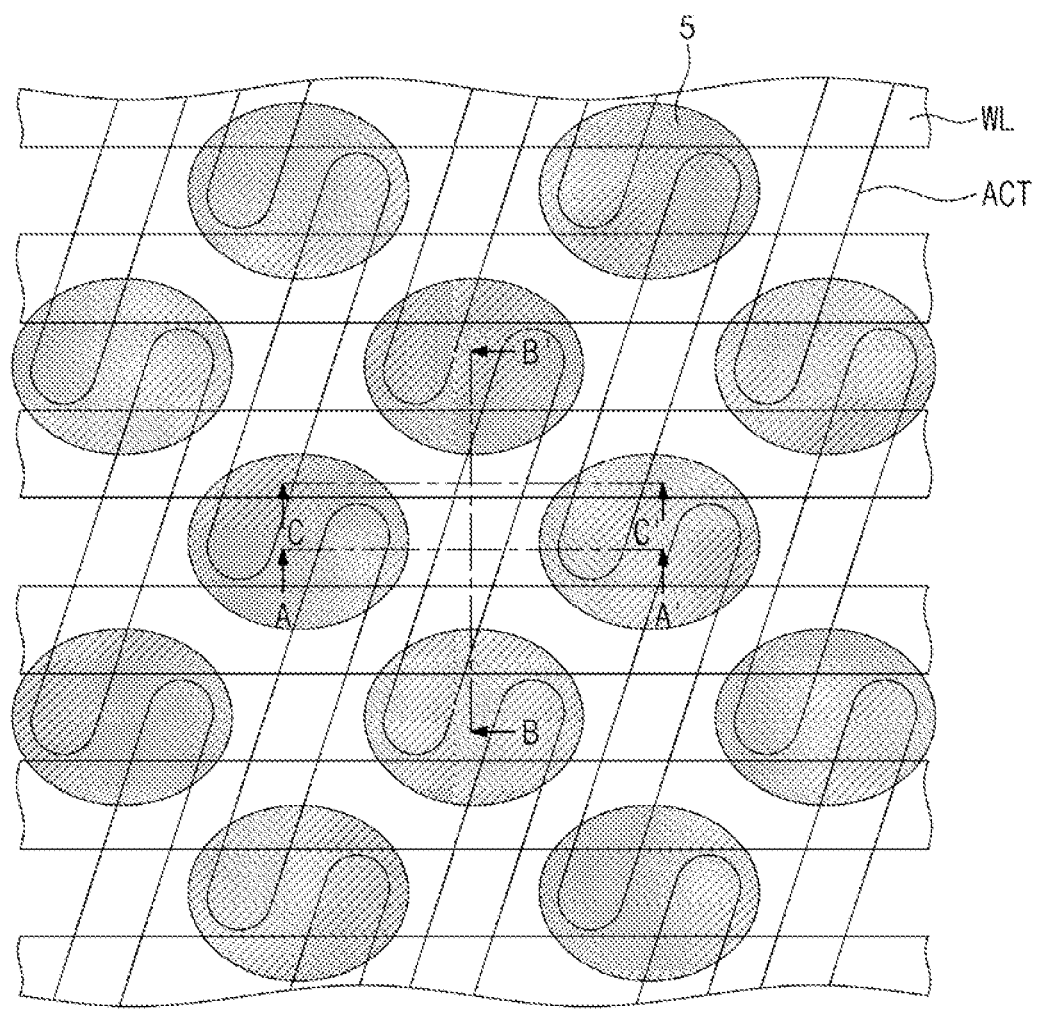
Figure 3B:
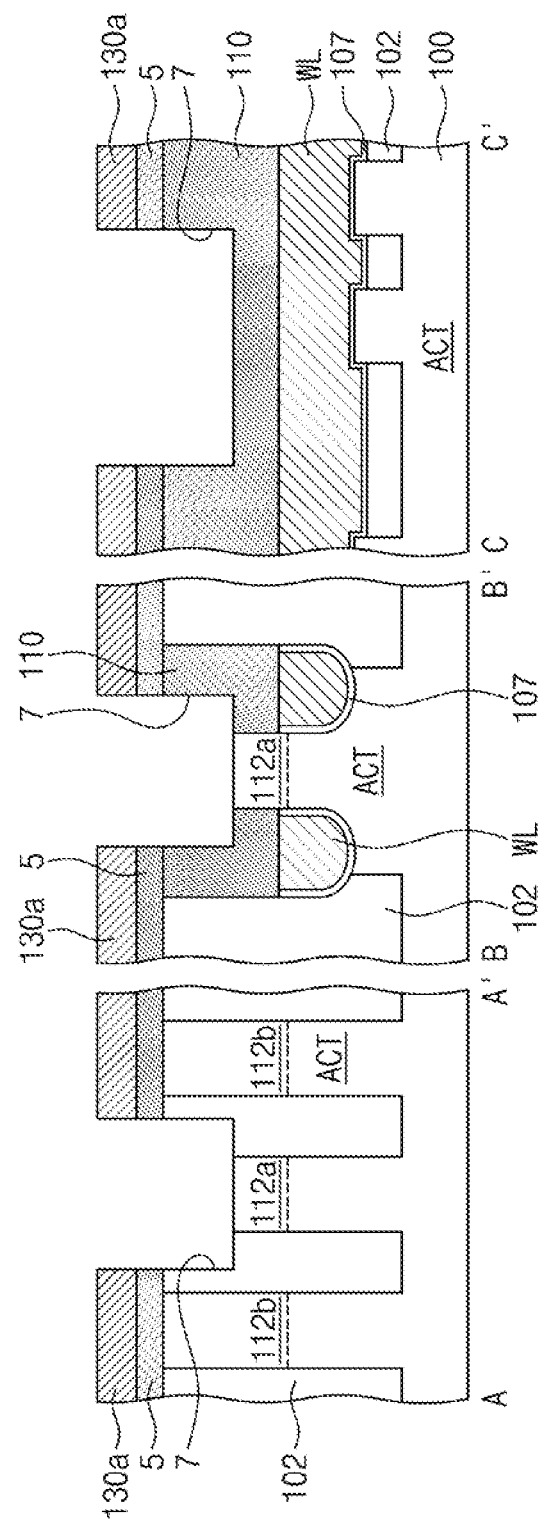

Referring to FIGS. 3A and 3B, the word line capping patterns 110 and the device isolation patterns 102 may be used as a mask to dope impurities into the active sections ACT, which may form first and second doped regions 112a and 112b. Thus, the first and second doped regions 112a and 112b are impurity doped regions. Ion implantation process may be performed to dope the impurities into the active sections ACT. The first doped region 112a and the second doped regions 112b may be formed respectively in the first source/drain region SDR1 and the second source/drain regions SDR2 as shown in FIGS. 2A and 2B. An insulation layer and a first polysilicon layer may be sequentially formed on an entire surface of the substrate 100. The first polysilicon layer may be patterned to form a polysilicon mask pattern 130a. A photolithography process and an etching process may be used to pattern the first polysilicon layer to form a polysilicon mask pattern 130a. The polysilicon mask pattern 130a may be used as an etching mask to etch the insulation layer, the device isolation pattern 102, the substrate 100, and the word line capping pattern 110 to simultaneously form a first recess region 7 and an interlayer dielectric pattern 5. The interlayer dielectric pattern 5 may be formed as a single layer or multiple layers including at least one of, for example, a silicon oxide ($SiO_2$) layer, a silicon nitride ($Si_3N_4$) layer, and a silicon oxynitride (SiON) layer. The interlayer dielectric pattern 5 may be formed to have island shapes spaced apart from each other, and may be formed to simultaneously cover end portions of two neighboring active sections ACT as shown in FIG. 3A. The first recess region 7 may be formed to have a net or mesh shape in a plan view, and may expose the first doped regions 112a. Due to the formation of the first recess region 7, a top surface of the first doped region 112a may be lower than a top surface of the second doped region 112b.

Figure 4A:
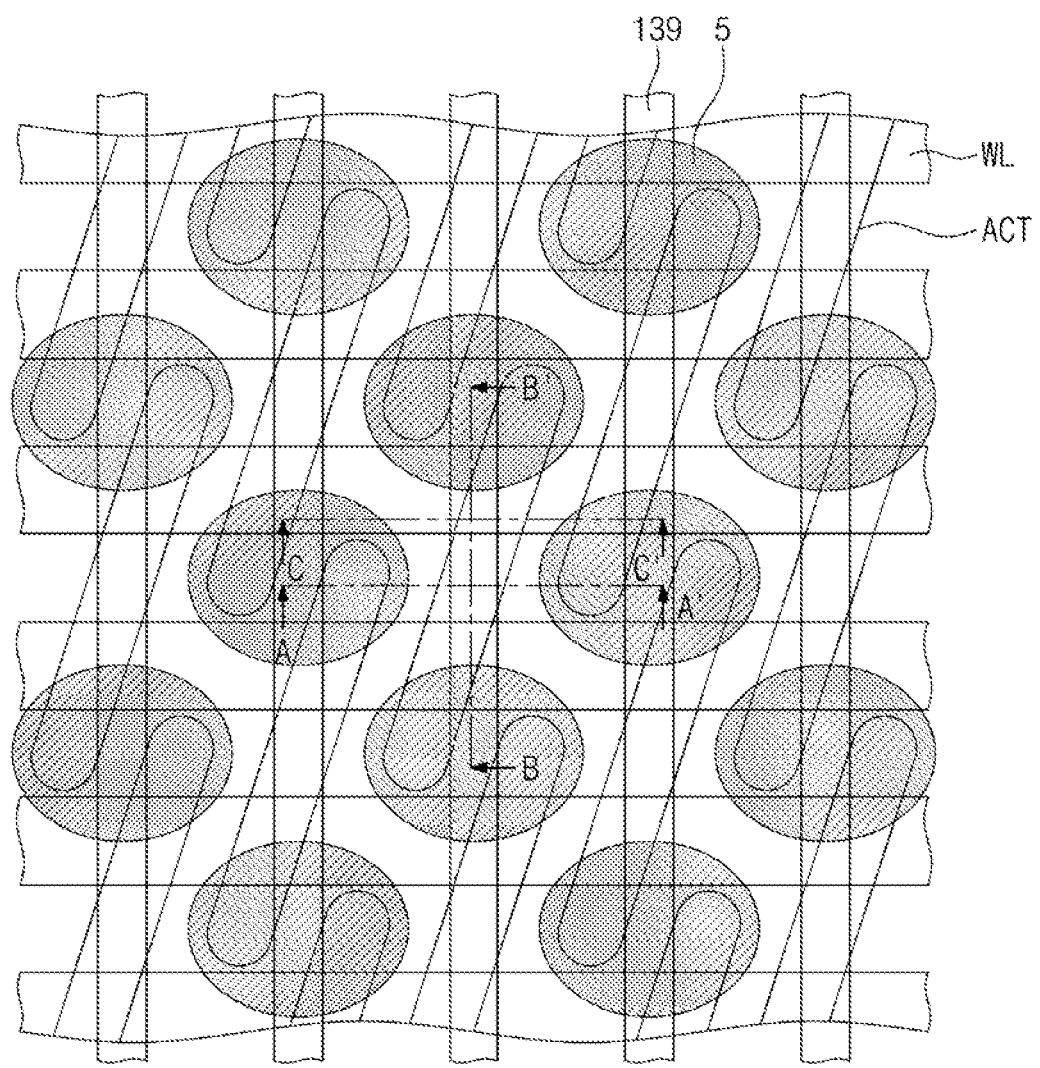
Figure 4B:
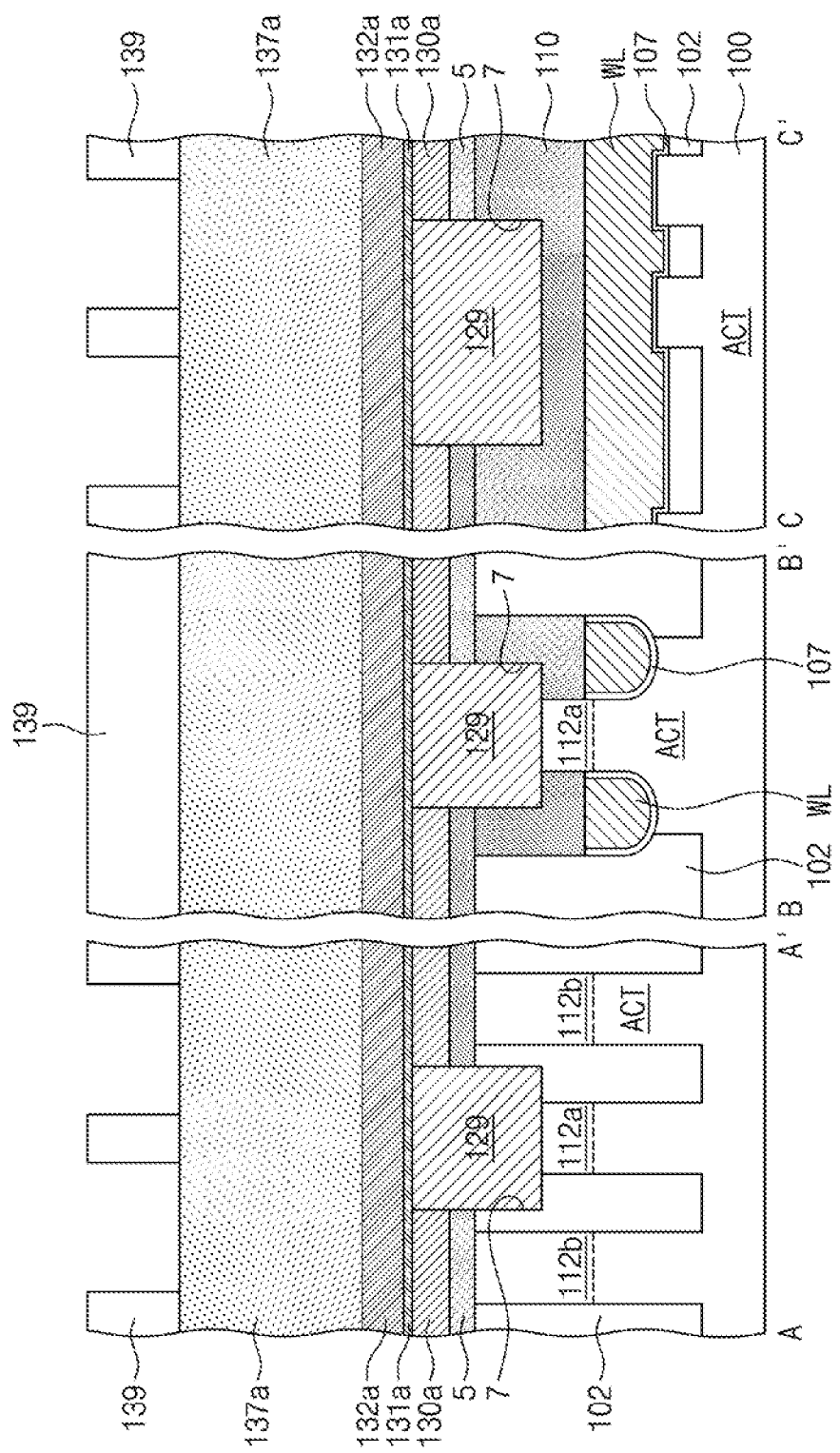

Referring to FIGS. 4A and 4B, a second polysilicon layer 129 may be formed on the entire surface of the substrate 100 such that the first recess region 7 may be filled with the second polysilicon layer 129. A planarization etching process may be performed to remove the second polysilicon layer 129 on the polysilicon mask pattern 130a to expose a top surface of the polysilicon mask pattern 130a. A bit line ohmic layer 131a, a bit line metal-containing layer 132a, and a bit line capping layer 137a may be sequentially formed on the polysilicon mask pattern 130a and the second polysilicon layer 129. The bit line ohmic layer 131a may be formed of a metal silicide such as, for example, cobalt silicide ($CoSi_2$). The bit line ohmic layer 131a may be formed by depositing a metal layer on the polysilicon mask pattern 130a and the second polysilicon layer 129, performing a heat treatment process to form metal silicide by reacting the metal layer with polysilicon of the polysilicon mask pattern 130a/the second polysilicon layer 129, and then removing the non-reacted portion of the metal layer.

First mask patterns 139 may be formed on the bit line capping layer 137a, and may define planar shapes of bit lines BL which will be discussed below. The first mask patterns 139 may be formed of a material layer such as, for example, an amorphous carbon layer (ACL), a silicon oxide ($SiO_2$) layer, or a photoresist pattern, and may have an etch selectivity to the bit line capping layer 137a. For the photoresist pattern, a photolithography process may be used to form the first mask patterns 139. For the amorphous carbon layer (ACL) and the silicon oxide ($SiO_2$) layer, a photolithography process and an etching process may be used to form the first mask patterns 139. The first mask patterns 139 may extend in a third direction D3 crossing both the first and second directions D1 and D2. The second direction D2 may be substantially perpendicular to the third direction D3. As shown in FIGS. 2A-4A, the first direction D1 may be inclined by a predetermined angle with respect to the second direction D2 or the third direction D3. The predetermined angle may vary to some degree. In an exemplary embodiment of the present inventive concept, the predetermined angle may range from about 10° to about 80°.

Figure 5A:
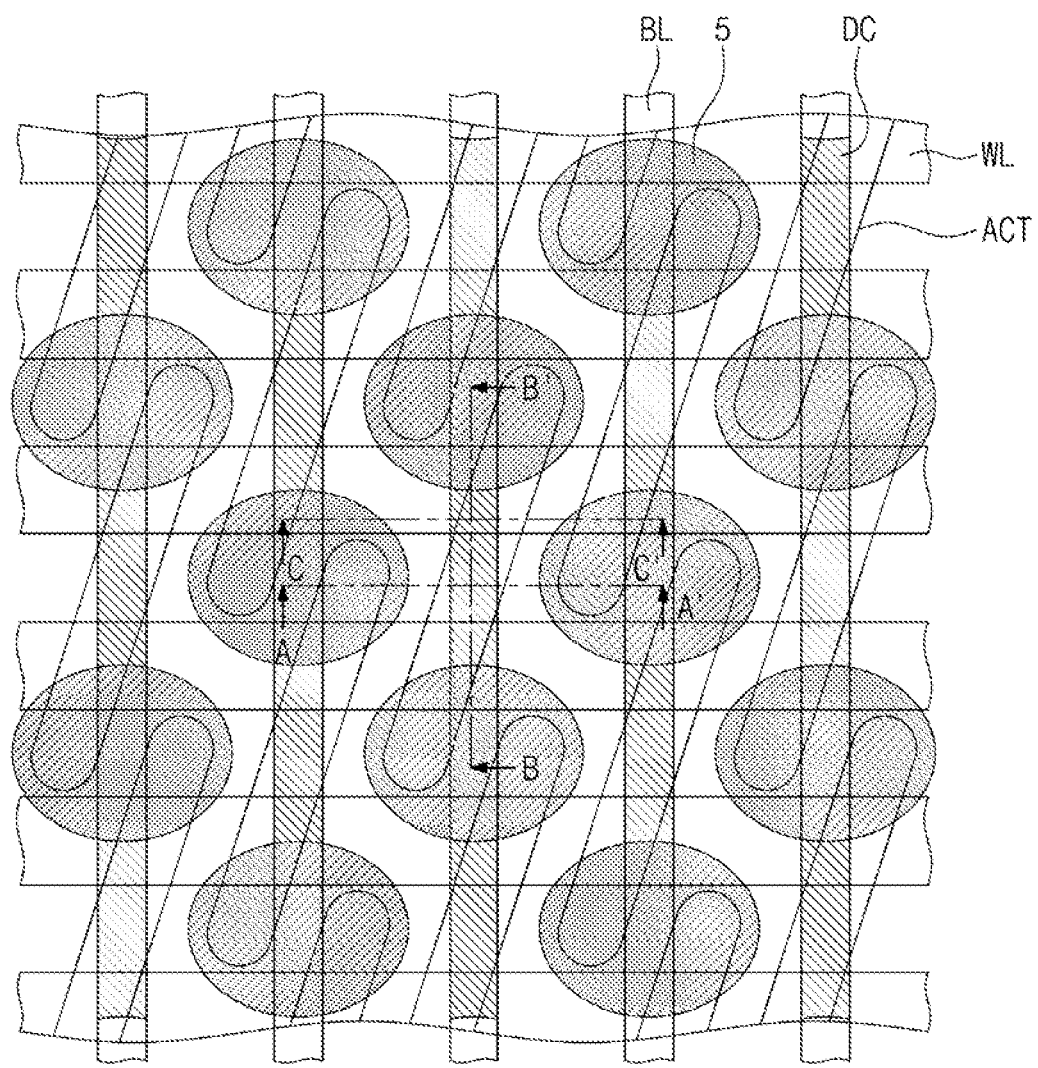
Figure 5B:
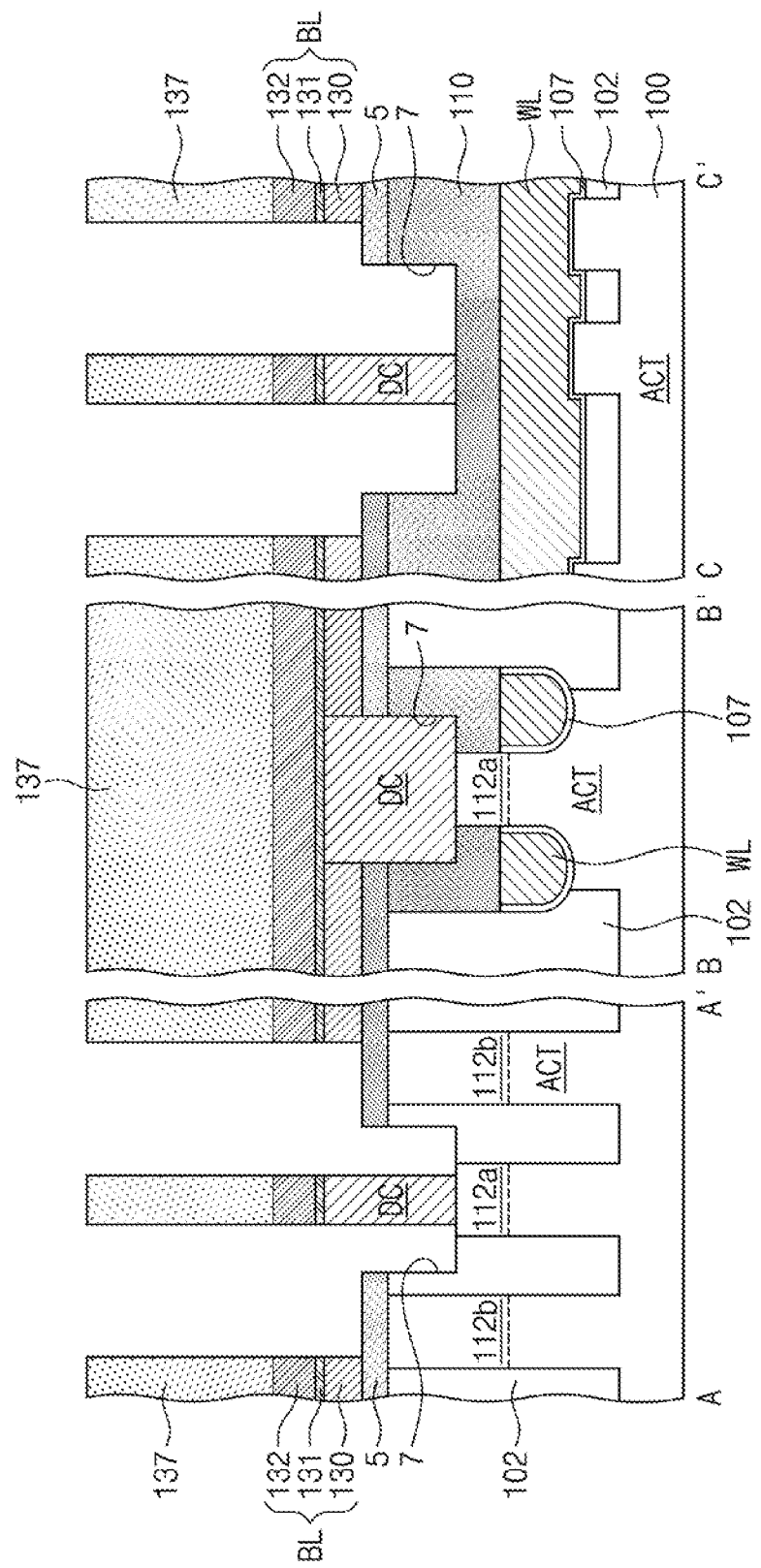

Referring to FIGS. 5A and 5B, the first mask patterns 139 may be used as an etching mask to sequentially etch the bit line capping layer 137a, the bit line metal-containing layer 132a, the bit line ohmic layer 131a, the polysilicon mask pattern 130a, and the second polysilicon layer 129 to form a bit line capping pattern 137, a bit line contact DC, and a bit line BL including a bit line polysilicon pattern 130, a bit line ohmic pattern 131, and a bit line metal-containing pattern 132. The etching process may partially expose a top surface of the interlayer dielectric pattern 5, and also partially expose an inner sidewall and a floor surface of first recess region 7. The first mask patterns 139 may then be removed.

Figure 6A:
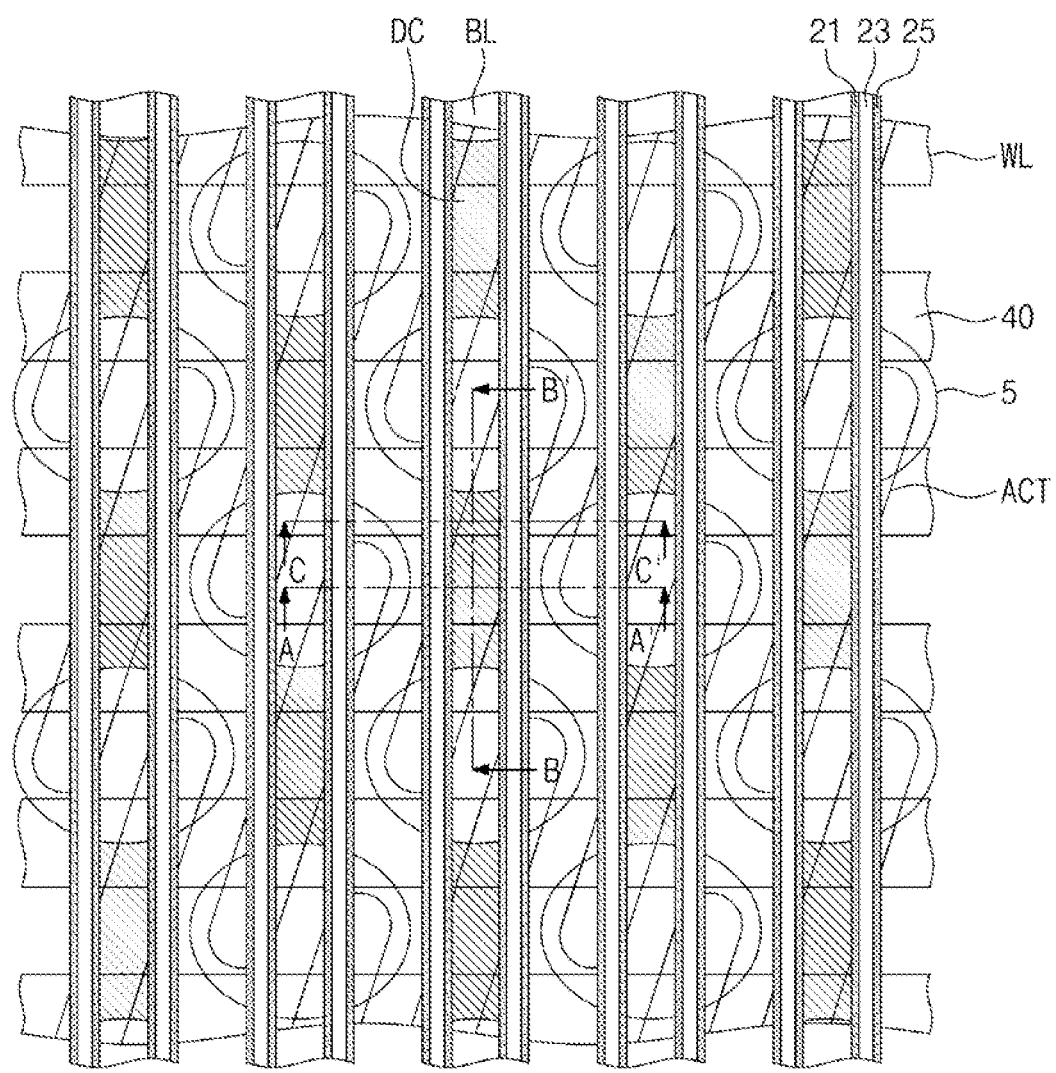
Figure 6A:
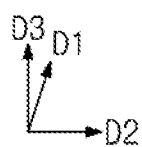
Figure 6B:
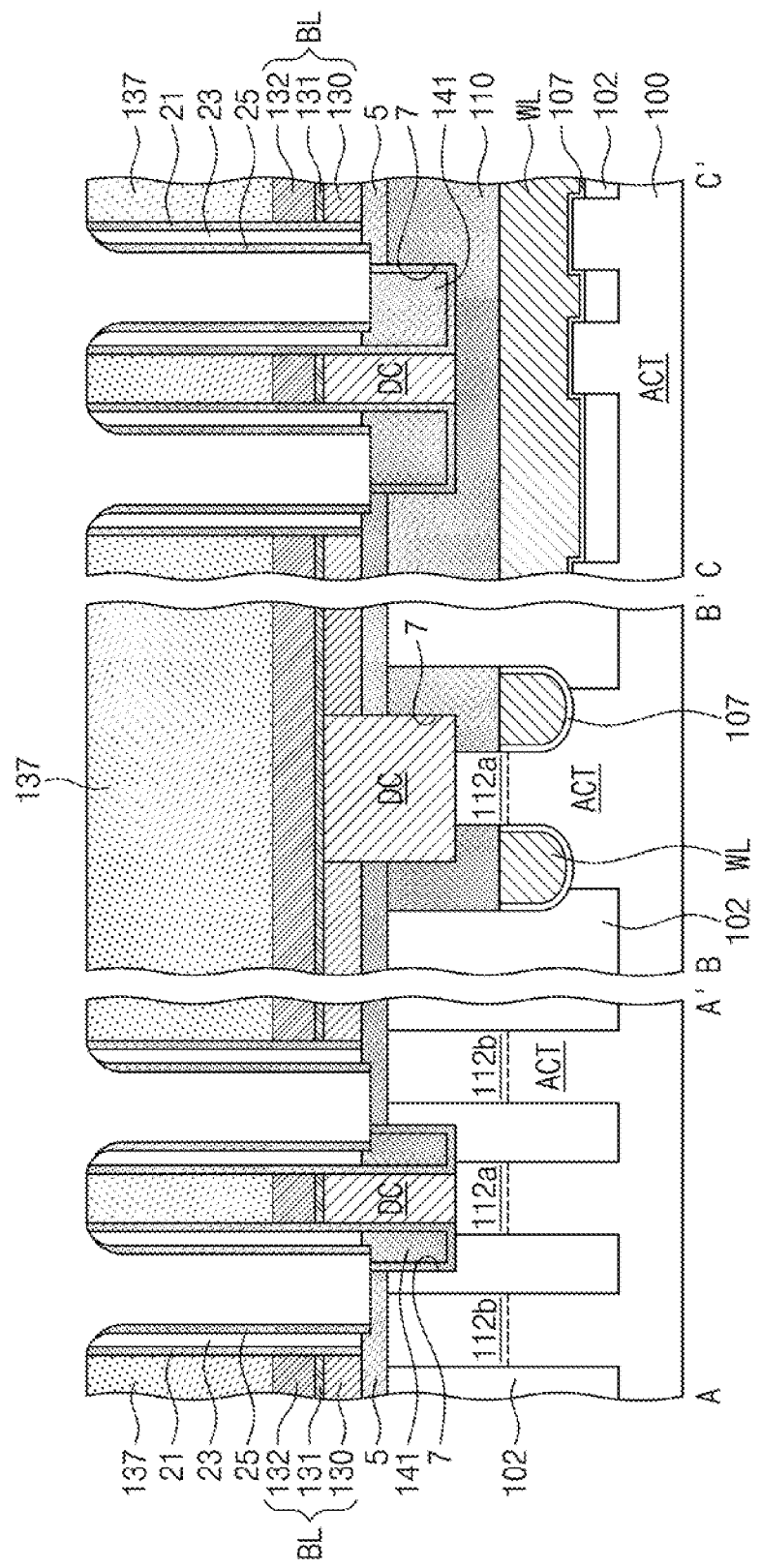

Referring to FIGS. 6A and 6B, a first spacer layer may be conformally formed on the entire surface of the substrate 100. The first spacer layer may conformally cover the floor surface and the inner sidewall of the first recess region 7, and may be formed of, for example, a silicon nitride ($Si_3N_4$) layer. An insulation layer such as a silicon nitride ($Si_3N_4$) layer may be formed on the entire surface of the substrate 100 so as to fill the first recess region 7, and then anisotropically etched to leave a lower buried dielectric pattern 141 in the first recess region 7. When the anisotropic etching process is performed, the first spacer layer may also be etched to form a first spacer 21. The top surface of the interlayer dielectric pattern 5 may also be exposed. A sacrificial spacer layer may be conformally formed on the entire surface of the substrate 100, and then anisotropically etched to form a sacrificial spacer 23 that covers a sidewall of the first spacer 21. The sacrificial spacer 23 may be formed of a material such as, for example, silicon oxide ($SiO_2$), and may have an etch selectivity to the first spacer 21. A second spacer layer may be conformally formed on the entire surface of the substrate 100, and then anisotropically etched to form a second spacer 25 to cover a sidewall of the sacrificial spacer 23. The second spacer 25 may be formed of, for example, a silicon nitride ($Si_3N_4$) layer. Thus, the first spacer 21, the sacrificial spacer 23, and the second spacer 25 may be formed to sequentially cover a sidewall of the bit line capping pattern 137 and a sidewall of the bit line BL. After the second spacer 25 is formed, top surface of the interlayer dielectric pattern 5 may be exposed. The first and second spacer layers, the sacrificial spacer layer and the insulation layer described above may each be formed by, for example, a chemical vapor deposition (CVD) process, and/or an atomic layer deposition (ALD) process.

Figure 7A:
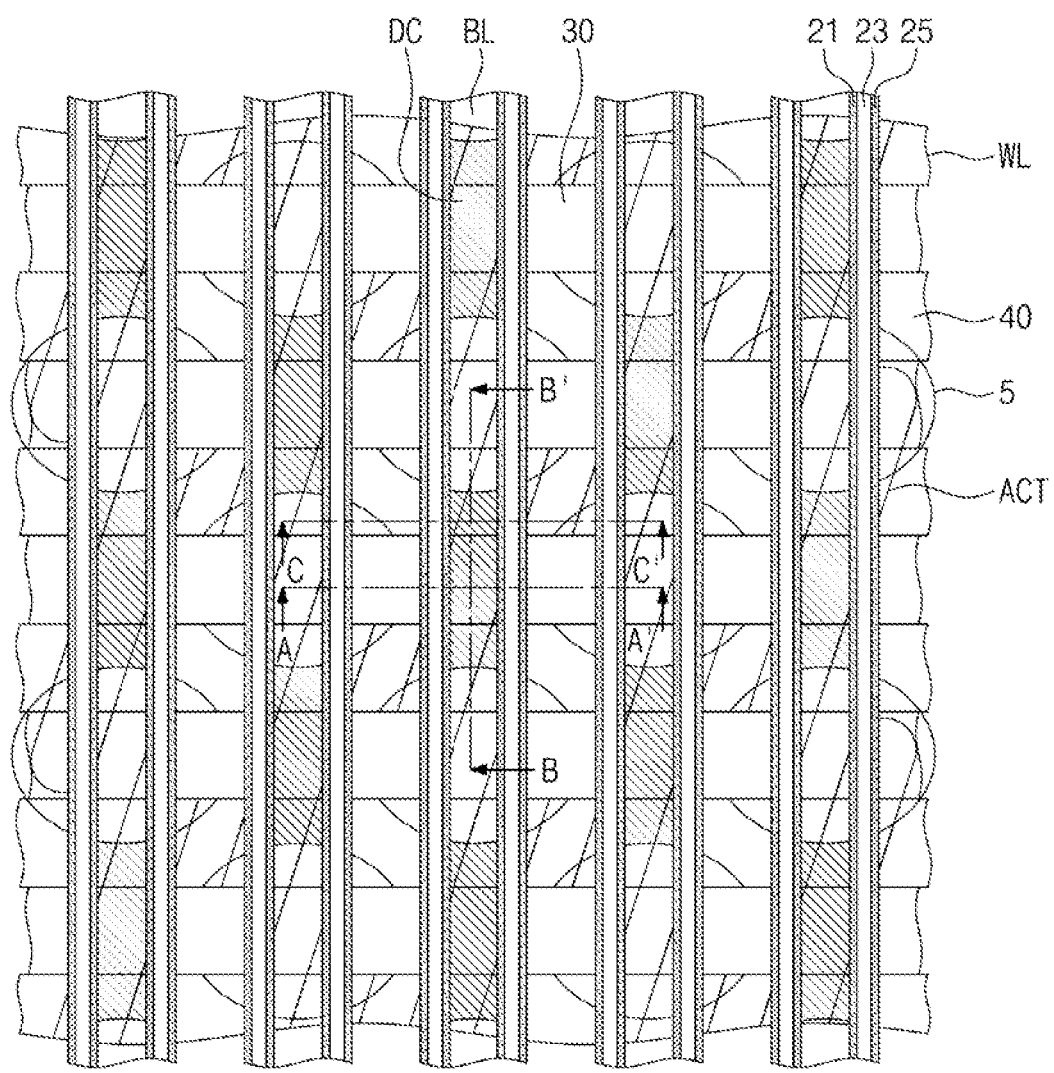
Figure 7B:
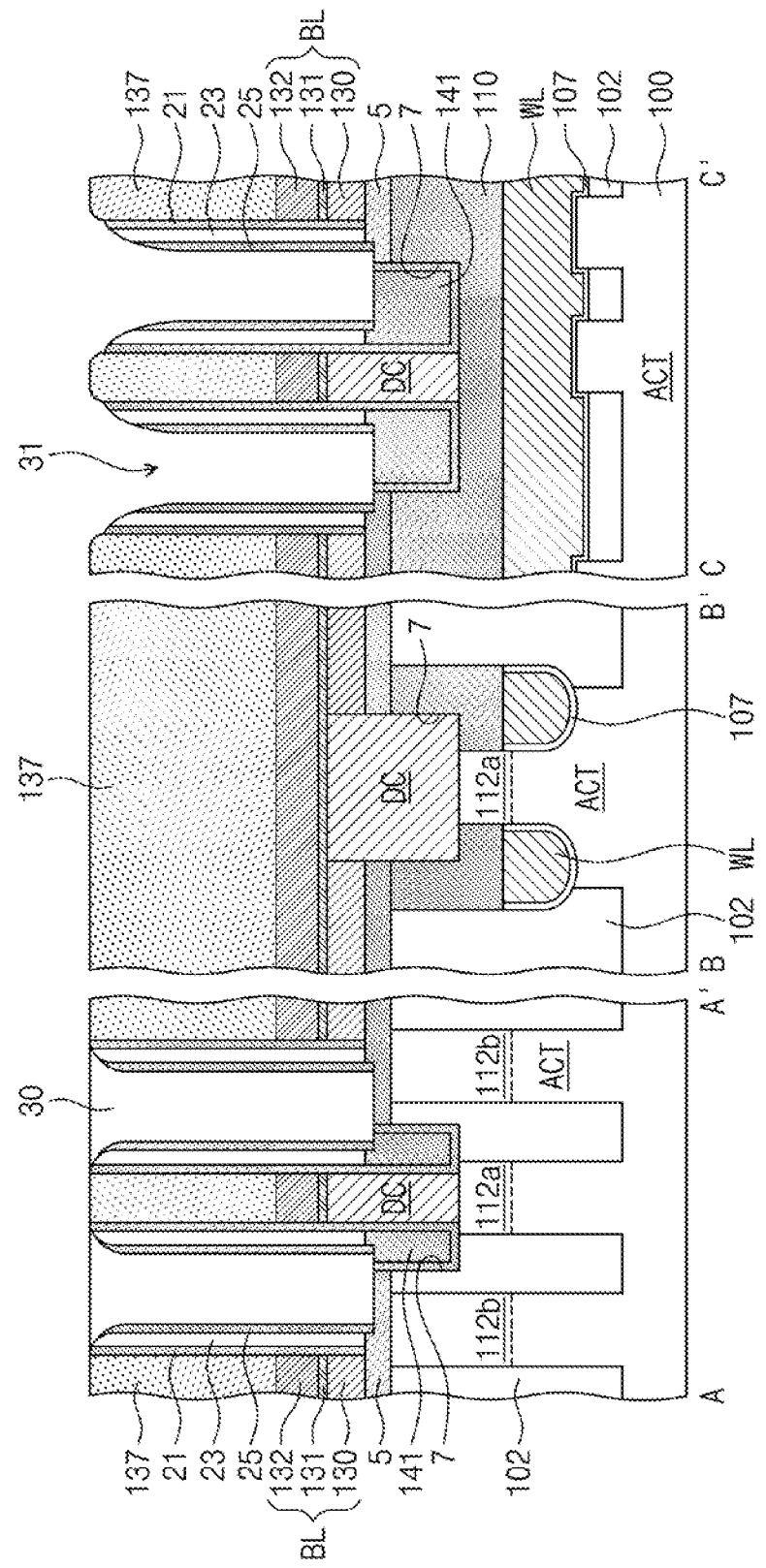

Referring to FIGS. 7A and 7B, a sacrificial layer may be formed on the entire surface of the substrate 100 and then patterned to form sacrificial patterns 30 that define positions of storage node contacts BC which will be discussed below. The sacrificial layer may be formed of, for example, a silicon oxide ($SiO_2$) layer, a polysilicon (Si) layer, or a silicon-germanium (SiGe) layer. The sacrificial patterns 30 may be formed to be spaced apart from each other between the bit lines BL, and may vertically overlap the second doped regions 112b. The sacrificial patterns 30 may be provided therebetween with first openings 31 that define positions of insulation fences 40 which will be discussed below. The first openings 31 may vertically overlap the word lines WL, and may expose a top surface of the lower buried dielectric pattern 141 and a top surface of the interlayer dielectric pattern 5. When the sacrificial layer is patterned, for example, etched, a partial etching may act on top surfaces of the first spacer 21, the sacrificial spacer 23, and the second spacer 25 that are exposed to the first openings 31. However, if an etching condition is properly controlled using a loading effect or the like, damages to the first spacer 21, the sacrificial spacer 23, and the second spacer 25 may be avoided. In this case, the first spacer 21, the sacrificial spacer 23, and the second spacer 25 may be controlled to have their top ends higher than a top surface of the bit line BL.

Figure 8A:
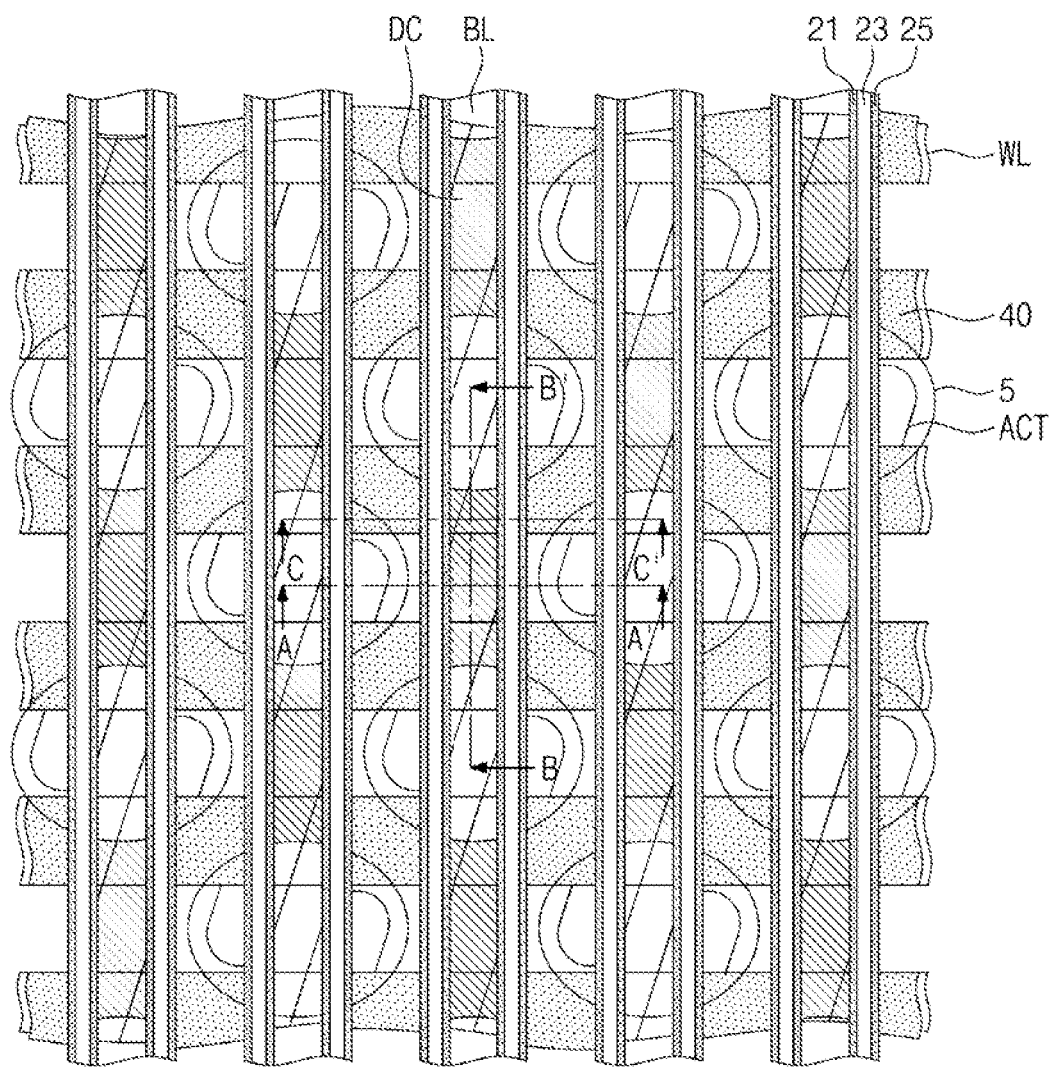
Figure 8B:
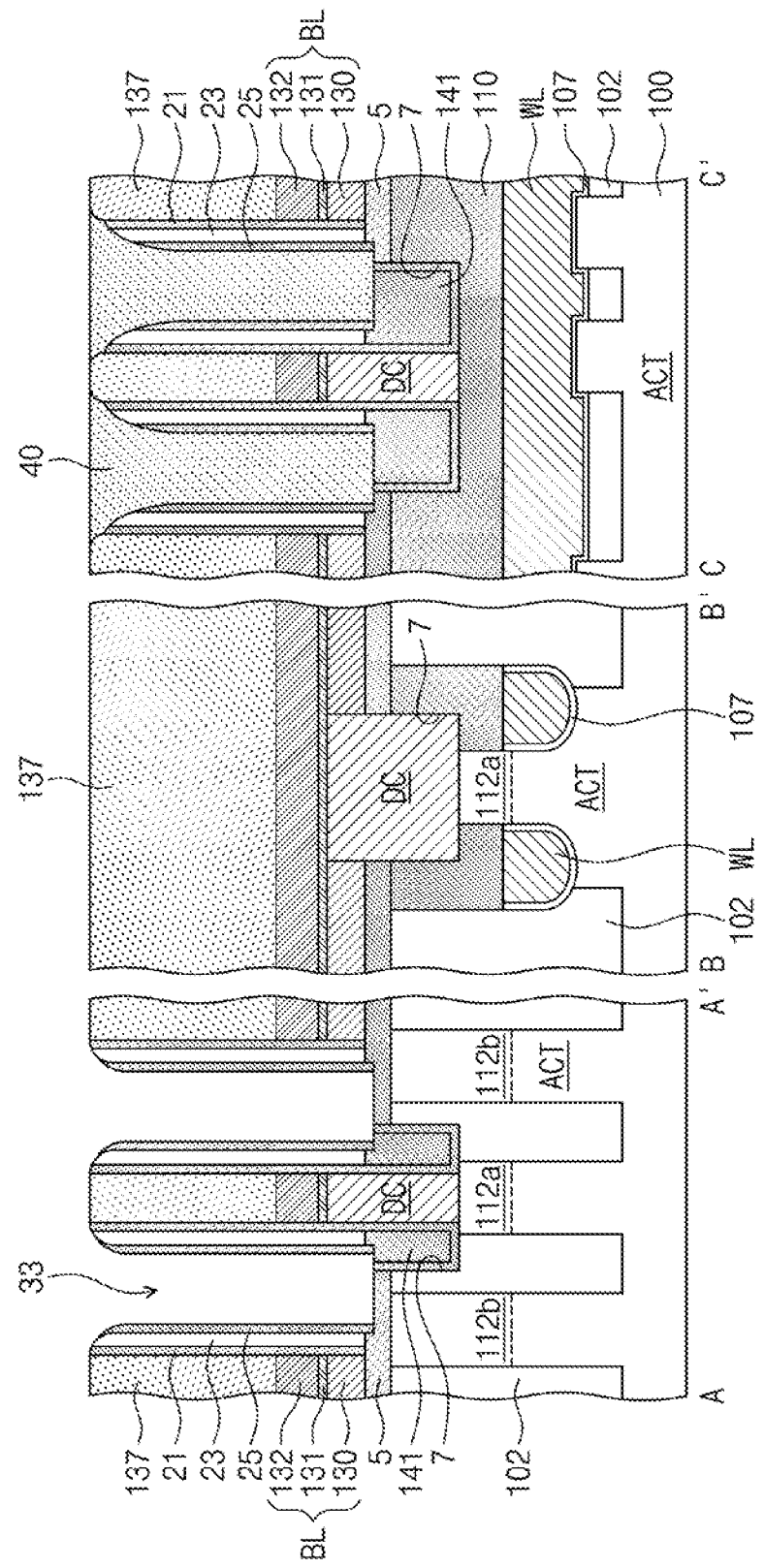

Referring to FIGS. 8A and 8B, an insulation layer such as, for example, a silicon nitride (Si₃N₄) layer may be formed on the entire surface of the substrate 100 such that the first openings 31 may be filled with the insulation layer. A planarization etching process may be performed to remove the insulation layer on the bit line capping pattern 137 and then to form insulation fences 40 in the first openings 31. The insulation fence 40 may limit or define a position of the storage node contact BC and may be adjacent to the sidewalls of the bit line BL and the bit line capping pattern 137. The planarization etching process may expose top surfaces of the sacrificial patterns 30. The exposed sacrificial patterns 30 may be removed to form second openings 33 that expose the interlayer dielectric patterns 5 and the exposed interlayer dielectric patterns 5 may vertically overlap at least a part of the second doped regions 112b.

Figure 9A:
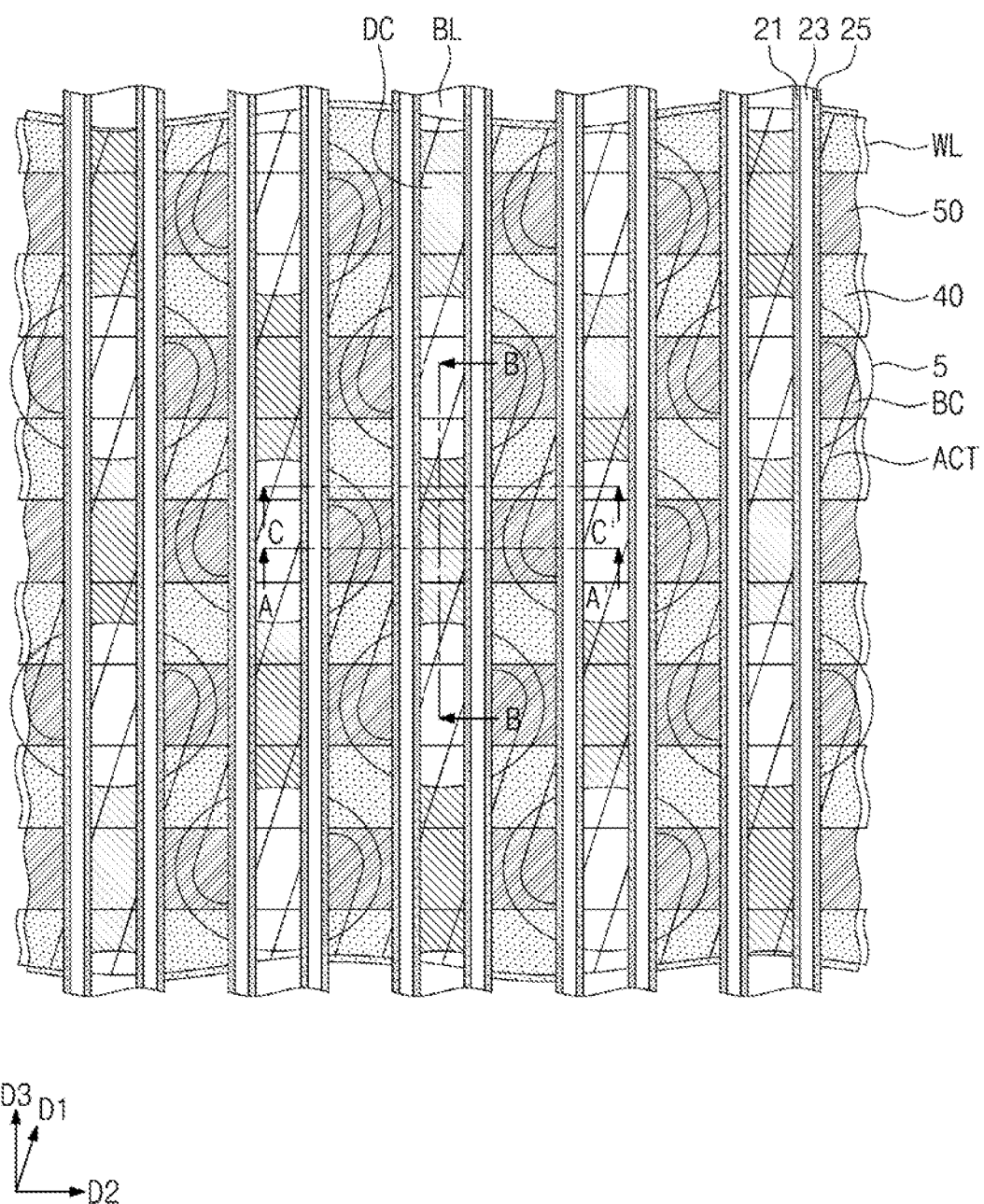
Figure 9B:
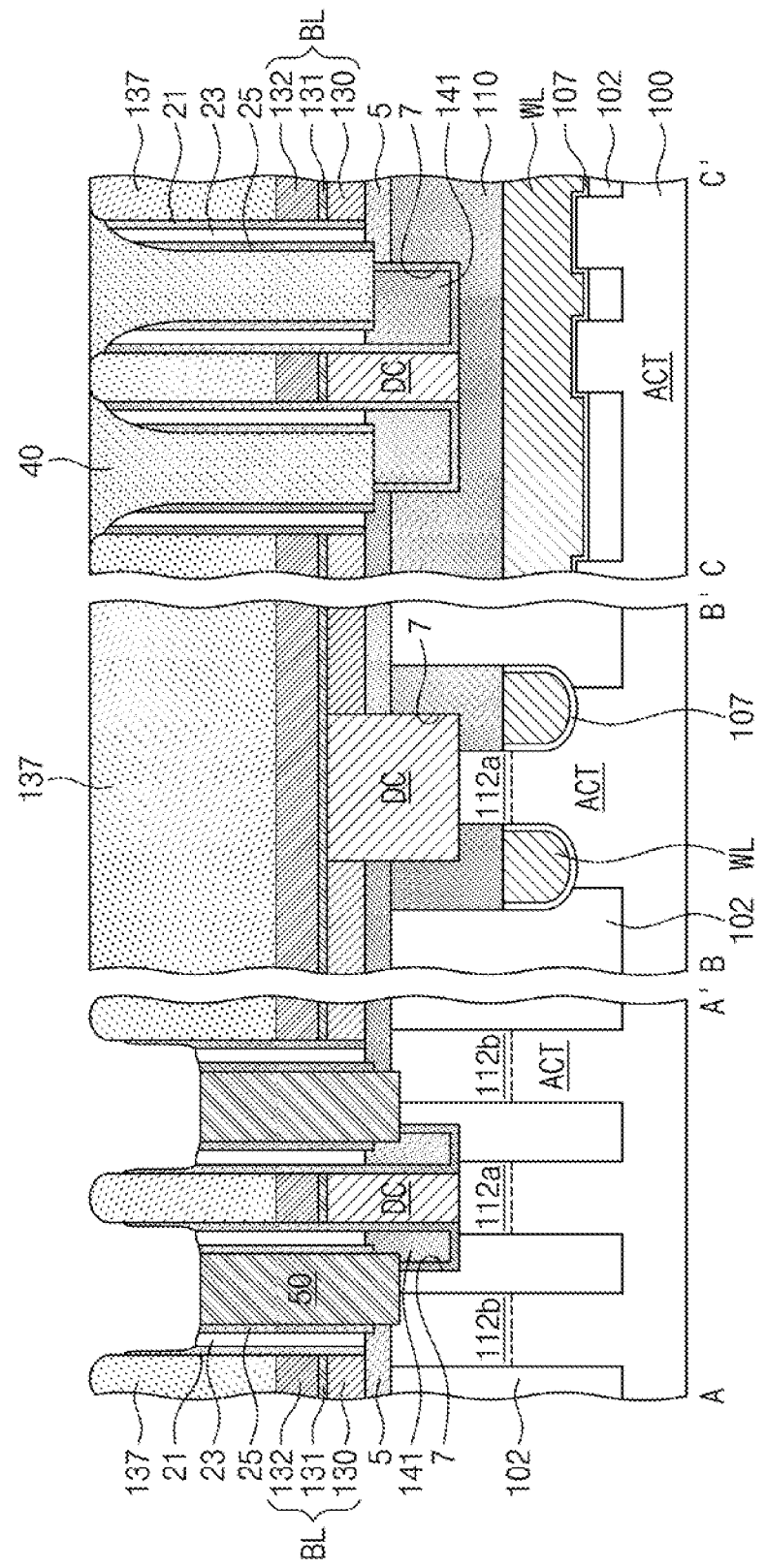

Referring to FIGS. 9A and 9B, a partial etching may be performed on the interlayer dielectric pattern 5 and its underlying device isolation pattern 102 and the substrate 100 that are exposed to the second openings 33 to expose the second doped region 112b. A polysilicon layer may be formed on the entire surface of the substrate 100 so as to fill the second openings 33, and then etched to form a preliminary storage node contact 50. The preliminary storage node contact 50 may have a top surface, which is shown in a cross-section taken along line A-A' as illustrated in FIG. 9B, may be lower than the top ends, which are shown in a cross-section taken along line A-A' as illustrated in FIG. 8B, of the first spacer 21, the sacrificial spacer 23, and the second spacer 25. Therefore, top portions of the first spacer 21, the sacrificial spacer 23, and the second spacer 25 may be exposed. The upper portions of the sacrificial spacer 23 and the second spacer 25 may be removed to cause the sacrificial spacer 23 and the second spacer 25 to have top ends whose heights (or levels) are similar to that of the top surface of the preliminary storage node contact 50. Therefore, an upper sidewall of the first spacer 21 may be exposed. For example, upper portions of the sacrificial spacer 23 and the second spacer 25 may be partially removed to expose the sidewall of the first spacer 21. Also, the second spacer 25 may have a top end whose height (or level) is lower than that of a top end of the first spacer 21. In addition, the upper portions of the sacrificial spacer 23 and the second spacer 25, that are disposed between the insulation fence 40 and the bit line capping pattern 137, may not be removed. This process may provide a larger process margin for forming landing pads LP which will be discussed below. When the upper portions of the sacrificial spacer 23 and the second spacer 25 are removed, an upper portion of the first spacer 21 may also be removed such that the first spacer 21 may have a reduced width.

Figure 10A:
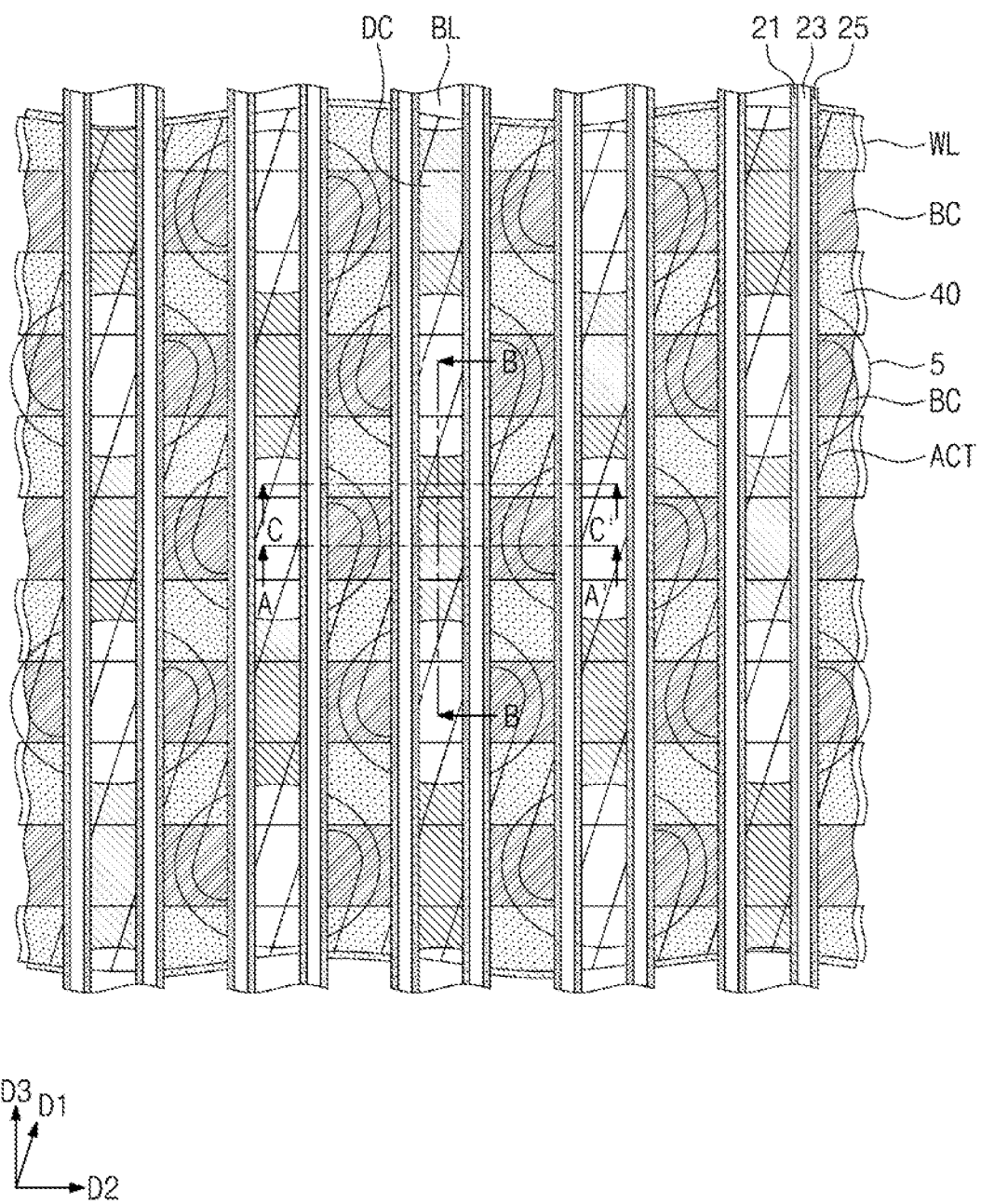
Figure 10B:
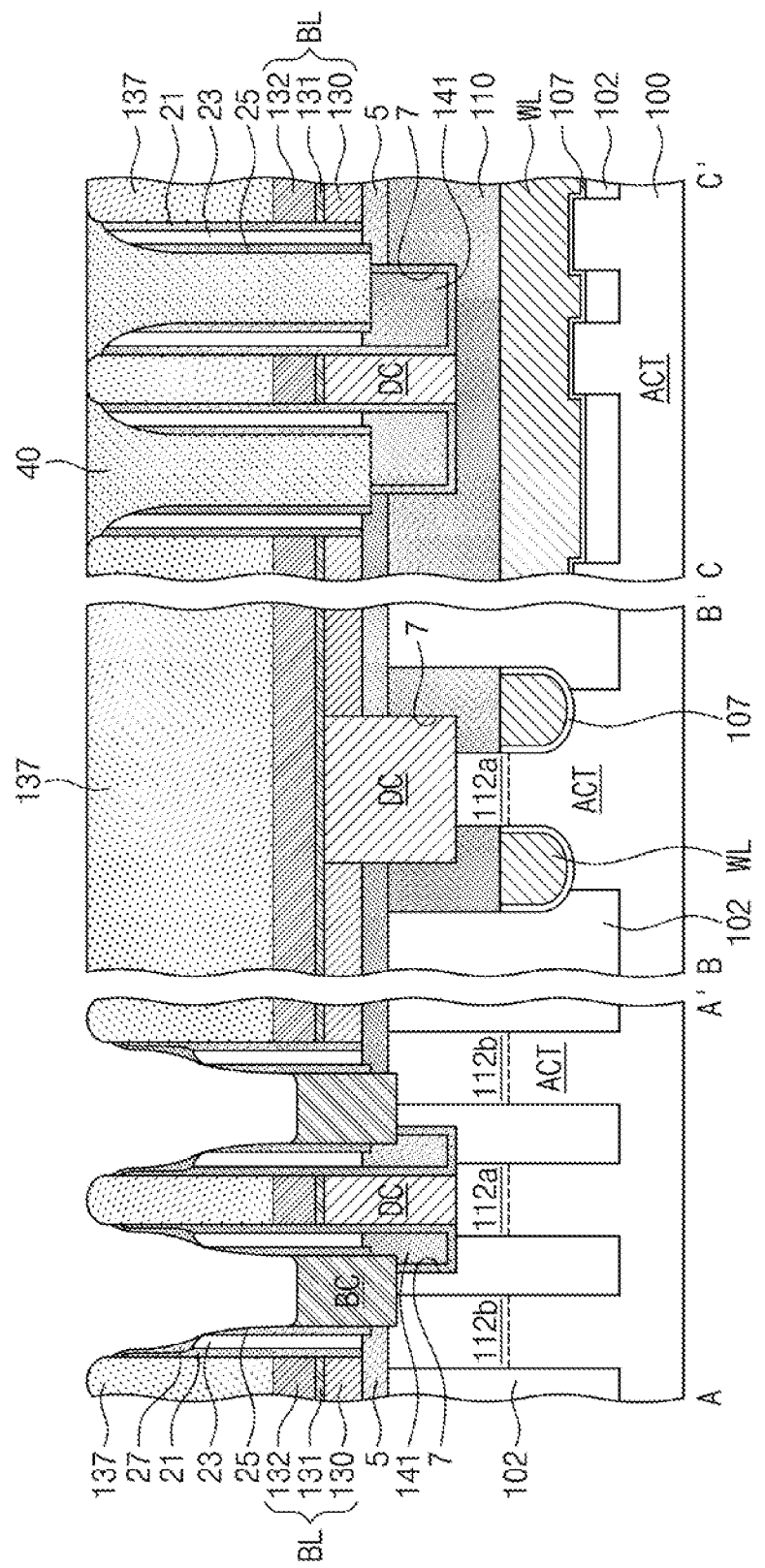

Referring to FIGS. 10A and 10B, a third spacer layer may be conformally formed on the entire surface of the substrate 100, and then anisotropically etched to form a third spacer 27 that covers the exposed upper sidewall of the first spacer 21. The third spacer 27 may have a lower portion that covers an exposed top end of the sacrificial spacer 23. The preliminary storage node contact 50 may be etched to expose an upper sidewall of the second spacer 25 and simultaneously to form a storage node contact BC. Thus, the storage node contact BC may be formed to be adjacent to the second spacer 25. The third spacer 27 may complement a damaged upper portion of the first spacer 21 and cover the sacrificial spacer 23, thereby serving to prevent the bit line BL from being attacked by an etchant used for etching the storage node contact BC and a cleaning solution used in a subsequent cleaning process. As a result, the bit line BL may be protected from damages.

Figure 11A:
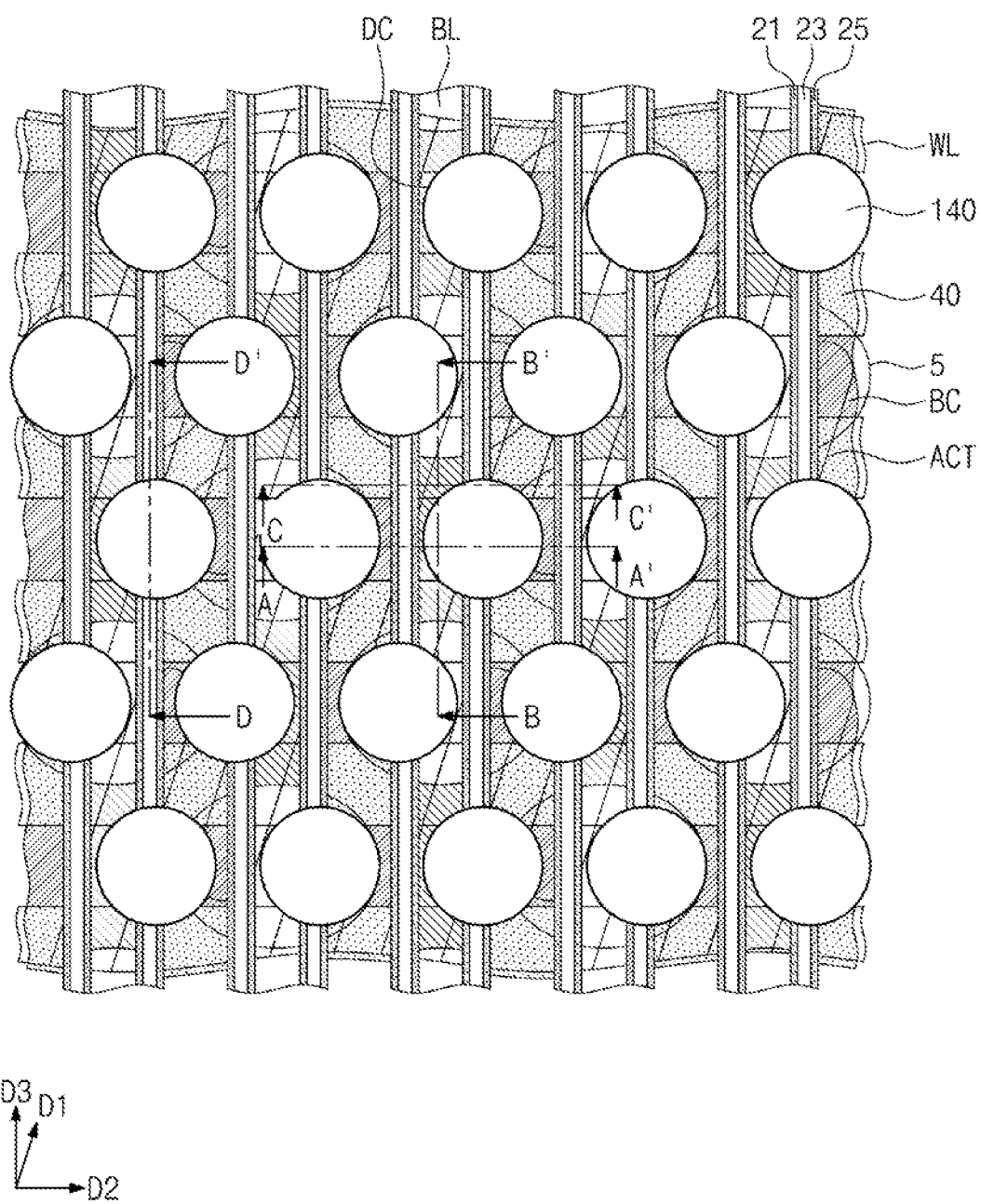
Figure 11B:
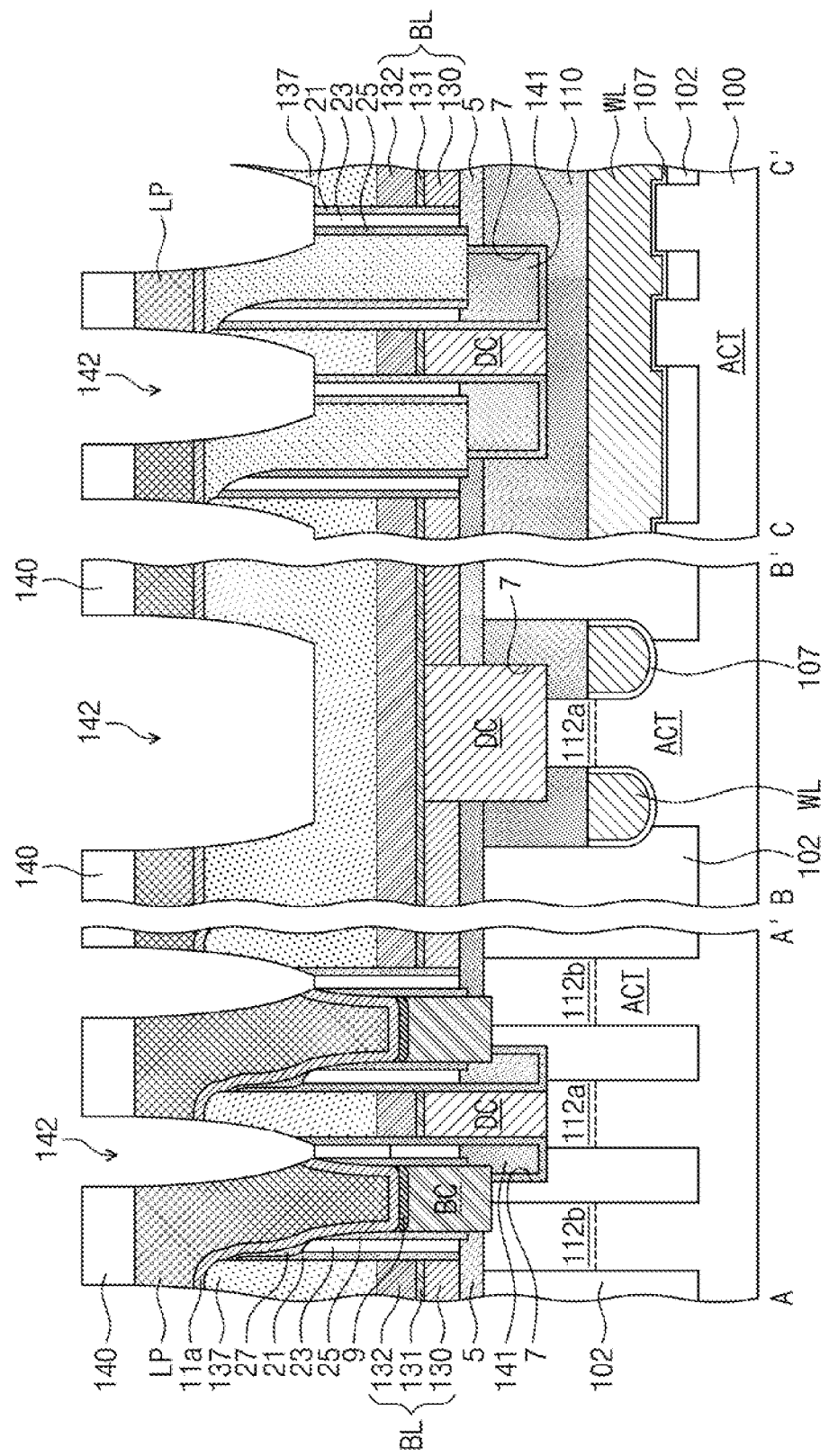
Figure 11C:
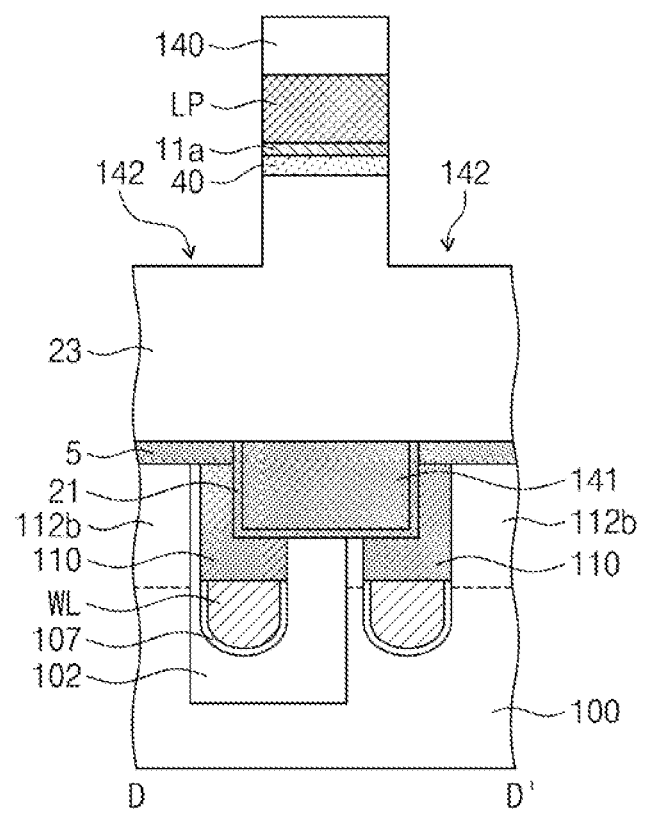
FIG. 11C is a cross-sectional view taken along line D-D' of FIG. 11A.

Referring to FIGS. 11A to 11C, a cleaning process may be performed to clean up a top surface of the storage node contact BC. The top surface of the storage node contact BC may be metal-silicided to form a storage node ohmic layer 9. The storage node ohmic layer 9 may be formed of, for example, a metal silicide layer such as a cobalt silicide (CoSi₂) layer. For example, the storage node ohmic layer 9 may be formed by depositing a metal layer, such as a cobalt (Co) layer, on storage node contact BC which is a polysilicon layer, performing a heat treatment process to form a metal silicide layer, such as a cobalt silicide (CoSi₂) layer, by reacting the metal layer with polysilicon of the storage node contact BC, and then removing the non-reacted portion of the metal layer. A diffusion barrier layer may be conformally formed on the entire surface of the substrate 100, and may be formed of, for example, a titanium nitride (TiN) layer or a tantalum nitride (TaN) layer. A landing pad layer may be formed on the entire surface of the substrate 100, and may fill a space between the bit line capping patterns 137. The landing pad layer may be a conductive layer which may include a metal-containing layer, and the metal-containing layer may include, for example, tungsten (W). Second mask patterns 140 may be formed on the landing pad layer, and may be formed of, for example, an amorphous carbon layer (ACL). For example, the amorphous carbon layer (ACL) may be formed on the landing pad layer, then a photolithography process and an etching process may be used to pattern the amorphous carbon layer (ACL) to form the second mask patterns 140. The second mask patterns 140 may limit or define positions of landing pads LP which will be discussed below, and may be formed to vertically overlap the storage node contacts BC. The second mask patterns 140 may be formed to have island shapes spaced apart from each other.

An etching process may be performed using the second mask patterns 140 as an etching mask to partially remove the landing pad layer, the diffusion barrier layer, and the bit line capping pattern 137, thereby forming a landing pad LP and a diffusion stop pattern 11a and also simultaneously forming second recess regions 142. The landing pad LP may be electrically connected to the storage node contact BC. The etching process may also remove the third spacer 27 on a side of the bit line capping pattern 137 to expose a top end of the sacrificial spacer 23. When the etching process is performed to form the landing pad LP and the second recess regions 142, an etchant supply may be controlled to suppress sidewalls of the landing pad LP from being etched, with the result that a width of the landing pad LP may be prevented from being reduced. Accordingly, a process margin for the landing pad LP may increase.

The etchant supply may be controlled as follows. During the time the landing pad layer is etched, there may be provided a first etchant that etches the landing pad layer. When the diffusion barrier layer is exposed during the etching process, the supply of the first etchant may be suspended or reduced, and then a second etchant that etches the diffusion barrier layer may be provided. The landing pad layer may be hardly etched by the second etchant, and after the supply of the second etchant, the sidewall portion of the landing pad LP may be either suppressed from being etched or etched at a reduced rate. Before the diffusion barrier layer is completely etched or before the third spacer 27 is exposed, the supply of the second etchant may be suspended or reduced, and then a third etchant that etches the third spacer 27 and the bit line capping pattern 137 may be provided. The landing pad layer may be hardly etched by the third etchant, and after the supply of the third etchant, the sidewall portion of the landing pad LP may be either suppressed from being etched or etched at a reduced rate.

The process above may form the second recess region 142. When viewed in FIG. 11C that shows a cross-section of the sacrificial spacer 23 taken along line D-D' of FIG. 11A in the third direction D3, an upper portion of the sacrificial spacer 23 may be recessed to form the second recess regions 142 on opposite sides of the second mask pattern 140.

Referring back to FIGS. 1A to 1D, when an isotropic etching process is performed to remove the sacrificial spacer 23, an etchant that etches the sacrificial spacer 23 may satisfactorily migrate or diffuse without being disturbed by the insulation fence 40 and the like, thereby cleanly removing the sacrificial spacer 23. The sacrificial spacer 23 may thus not remain, but may be completely replaced by an air gap region AG. Accordingly, the air gap region AG may be evenly provided on the sidewall of the bit line BL, and as a result, capacitance distribution of the bit line BL may be reduced.

The second mask pattern 140 may be removed to expose a top surface of the landing pad LP, and may be removed before the air gap region AG is formed. In a state that the second mask pattern 140 and the sacrificial spacer 23 are removed, a first upper buried dielectric pattern 144a may be formed to cover an upper side surface of the second recess region 142, and a second upper buried dielectric pattern 144b may be formed to cover a floor surface of the second recess region 142. The first upper buried dielectric pattern 144a and the second upper buried dielectric pattern 144b may be simultaneously formed using a material whose step coverage is much inferior. The second upper buried dielectric pattern 144b may also be formed on an entrance of the air gap region AG, and thus may narrow the entrance. For example, the second upper buried dielectric pattern 144b may narrow an upper width of the air gap region AG at the floor surface of the second recess region 142. The first and second upper buried dielectric patterns 144a and 144b may be formed of, for example, a silicon carbonitride (SiCN) layer having a relatively high carbon content.

A third upper buried dielectric layer may be conformally formed on the entire surface of the substrate 100 to cover the first and second upper buried dielectric patterns 144a and 144b and a sidewall of the second recess region 142, and simultaneously to close the entrance of the air gap region AG. The third upper buried dielectric layer may be formed of, for example, a silicon carbonitride (SiCN) layer having a relatively low carbon content.

A fourth upper buried dielectric layer may be formed on the entire surface of the substrate 100 to fill the second recess regions 142. The fourth upper buried dielectric layer may be formed of, for example, a silicon nitride ($Si_3N_4$) layer. A planarization etching process may be performed to remove the third and fourth upper buried dielectric layers on the landing pad LP and to expose the top surface of the landing pad LP, thereby simultaneously forming first, second, third, and fourth upper dielectric patterns 144a, 144b, 146, and 148 in the second recess regions 142. A conductive pattern BE may be formed on the landing pad LP. In general, addition of the carbon content to the silicon carbonitride (SiCN) layers causes decrease in the density of the silicon carbonitride (SiCN) layers, as well as decrease in hardness and transparency. Since the third upper buried dielectric pattern 146 may have a relatively low carbon content, the third upper buried dielectric pattern 146 may have a density greater than those of the first and second upper buried dielectric patterns 144a and 144b and less than that of the fourth upper buried dielectric pattern 148.

Figure 12:
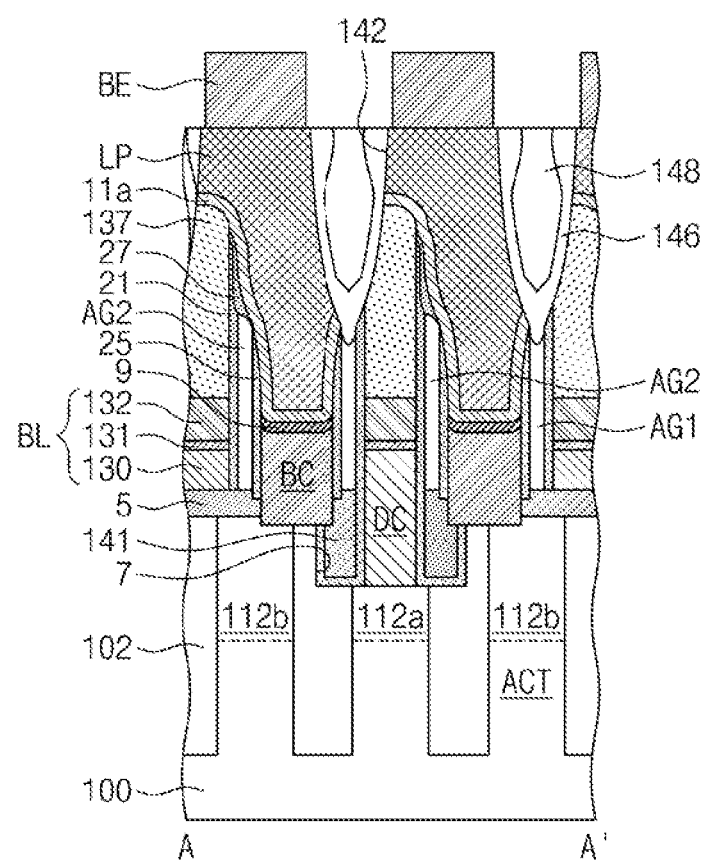
FIG. 12 is a cross-sectional view showing a semiconductor memory device according to an exemplary embodiment of the present inventive concept.

FIG. 12 is a cross-sectional view showing a semiconductor memory device according to an exemplary embodiment of the present inventive concept.

Referring to FIG. 12, a semiconductor memory device according to the present exemplary embodiment may include no first and second upper buried dielectric patterns 144a and 144b disclosed in FIG. 1B. The third upper buried dielectric pattern 146 may be in contact with the sidewall and the floor surface of the second recess region 142, and may also limit or define a top end of the air gap region AG. Each of the third and fourth upper buried dielectric patterns 146 and 148 may include at least one of, for example, a silicon nitride ($Si_3N_4$) layer and a silicon carbonitride (SiCN) layer. For example, the third upper buried dielectric pattern 146 may have a density less than that of the fourth upper buried dielectric pattern 148. The third upper buried dielectric pattern 146 may have a carbon content greater than that of the fourth upper buried dielectric pattern 148. Other configurations may be identical or similar to those discussed with reference to FIGS. 1A to 1D. Thus, a semiconductor device according to the present exemplary embodiment may be fabricated to have enhanced reliability.

Figure 13:
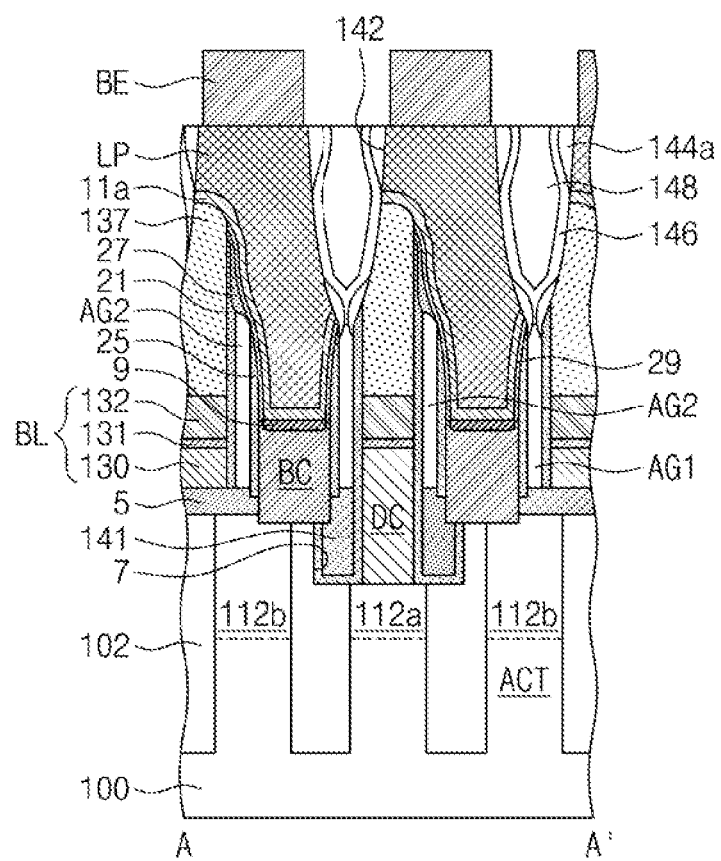
FIG. 13 is a cross-sectional view showing a semiconductor memory device according to an exemplary embodiment of the present inventive concept.

FIG. 13 is a cross-sectional view showing a semiconductor memory device according to an exemplary embodiment of the present inventive concept.

Referring to FIG. 13, a semiconductor memory device according to the present exemplary embodiment may further include a fourth spacer 29 that covers the second spacer 25 and a sidewall of the third spacer 27. The fourth spacer 29 may cover an upper sidewall of the second spacer 25. The fourth spacer 29 may be formed of a material the same as that of the second and third spacers 25 and 27. For example, the fourth spacer 29 may be formed of, for example, a silicon nitride ($Si_3N_4$) layer. The fourth spacer 29 may be formed after the storage node contact BC is formed as illustrated in FIG. 10B. The fourth spacer 29 may complement the second and third spacers 25 and 27 that are damaged during the etching process for forming the storage node contact BC, and may cover a possibly exposed portion of the sacrificial spacer 23, thereby serving to prevent the bit line BL from being attacked by a cleaning solution used for the cleaning process that cleans the top surface of the storage node contact BC. As a result, the bit line BL may be protected from damages. In addition, the second, third, and fourth spacers 25, 27, and 29 may cover the sacrificial spacer 23, and thus may prevent the diffusion stop pattern 11a from being damaged resulting from an etchant used for the etching process in which the sacrificial spacer 23 is removed to form the air gap region AG. A semiconductor device may eventually be fabricated to have enhanced reliability. Other configurations may be identical or similar to those discussed with reference to FIGS. 1A to 1D.

According to an exemplary embodiment of the present inventive concept, a semiconductor memory device may be provided to have enhanced reliability.

In a method of fabricating a semiconductor memory device according to an exemplary embodiment of the present inventive concept, an increased process margin for the landing pad may be obtained.

The foregoing is illustrative of exemplary embodiments of the present inventive concept and is not to be construed as limiting thereof. Although a few specific exemplary embodiments have been described, those skilled in the art will readily appreciate that many modifications are possible in the exemplary embodiments without materially departing from the spirit and scope of the present inventive concept as defined by the appended claims.

What is claimed is:

1. A semiconductor memory device comprising:
a substrate including a first impurity region and two second impurity regions, with the first impurity region disposed between a first second impurity region and a second second impurity region of the two second impurity regions;
a bit line structure electrically connected to the first impurity region of the substrate, the bit line structure including a bit line and a bit line capping pattern that is disposed on the bit line;
a first contact electrically connected to the first second impurity region of the substrate and disposed adjacent to a first side of the bit line structure;
a second contact electrically connected to the second second impurity region of the substrate and disposed adjacent to a second side of the bit line structure that is opposite to the first side of the bit line structure;
a first bit line spacer, which is constituted by one first spacer, one second spacer and a first air gap region, disposed between the first contact and the first side of the bit line structure;
a second bit line spacer, which is constituted by an other one first spacer, an other one second spacer and a second air gap region, disposed between the second contact and the second side of the bit line structure;
a first landing pad disposed on the first contact;
a second landing pad disposed on the second contact and extending on the second bit line spacer and on a top surface of the bit line capping pattern of the bit line structure; and
an insulation pattern disposed between the first landing pad and the second landing pad and on the first bit line spacer,
wherein the first bit line spacer includes the one first spacer that is disposed on the first side of the bit line structure, the one second spacer that is disposed on a side of the first contact, and the first air gap region that is disposed between the one first spacer and the one second spacer,
a top surface of the one first spacer of the first bit line spacer is higher than a top surface of the one second spacer of the first bit line spacer,
the insulation pattern includes a first upper buried dielectric pattern, a second upper buried dielectric pattern that is disposed on the first upper buried dielectric pattern, and a third upper buried dielectric pattern that is disposed on the second upper buried dielectric pattern,
the first upper buried dielectric pattern of the insulation pattern includes silicon nitride,
the second upper buried dielectric pattern of the insulation pattern includes silicon carbon nitride, and
the third upper buried dielectric pattern includes silicon nitride.

2. The semiconductor memory device of claim 1, wherein top surfaces of at least two of the first upper buried dielectric pattern, the second upper buried dielectric pattern, or the third upper buried dielectric pattern are substantially coplanar with each other.

3. The semiconductor memory device of claim 1, wherein a top surface of the insulation pattern is substantially coplanar with a top surface of at least one of the first landing pad or the second landing pad.

4. The semiconductor memory device of claim 1, wherein the second bit line spacer includes the other one first spacer that is disposed on the second side of the bit line structure, the other one second spacer that is disposed on a side of the second contact, and the second air gap region that is disposed between the other one first spacer and the other one second spacer, and
a top surface of the other one first spacer of the second bit line spacer is higher than a top surface of the other one second spacer of the second bit line spacer.

5. The semiconductor memory device of claim 1, wherein a top surface of at least one of the first landing pad or the second landing pad is substantially coplanar with a top surface of at least one of the first upper buried dielectric pattern, the second upper buried dielectric pattern, or the third upper buried dielectric pattern of the insulation pattern.

6. The semiconductor memory device of claim 1, wherein the bit line capping pattern of the bit line structure includes a recess portion and
the insulation pattern contacts the recess portion of the bit line capping pattern of the bit line structure, the first landing pad, and the second landing pad.

7. The semiconductor memory device of claim 4, wherein a top surface of the first air gap region is lower than a top surface of the second air gap region.

8. The semiconductor memory device of claim 4, wherein the second bit line spacer further includes a third spacer that is disposed on the second air gap region and contacts the other one first spacer of the second bit line spacer.

9. The semiconductor memory device of claim 4, wherein the top surface of the other one first spacer of the second bit line spacer is higher than the top surface of the one first spacer of the first bit line spacer.

10. The semiconductor memory device of claim 1, wherein the top surface of the one first spacer of the first bit line spacer is higher than a top surface of the first air gap region of the first bit line spacer.

11. The semiconductor memory device of claim 4, wherein the top surface of the other one first spacer of the second bit line spacer is higher than a top surface of the second air gap region of the second bit line spacer.

12. A semiconductor memory device comprising:
a substrate including a first impurity region and two second impurity regions, with the first impurity region disposed between a first second impurity region and a second second impurity region of the two second impurity regions;
a bit line structure electrically connected to the first impurity region of the substrate, the bit line structure including a bit line and a bit line capping pattern that is disposed on the bit line, the bit line capping pattern including a recess portion;
a first contact electrically connected to the first second impurity region of the substrate and disposed adjacent to a first side of the bit line structure;
a second contact electrically connected to the second second impurity region of the substrate and disposed adjacent to a second side of the bit line structure that is opposite to the first side of the bit line structure;
a first bit line spacer, which is constituted by one first spacer, one second spacer and a first air gap region, disposed between the first contact and the first side of the bit line structure;
a second bit line spacer, which is constituted by an other one first spacer, an other one second spacer and a second air gap region, disposed between the second contact and the second side of the bit line structure;

a first landing pad disposed on the first contact;
a second landing pad disposed on the second contact, and extending on the second bit line spacer and on a top surface of the bit line capping pattern; and
an insulation pattern disposed between the first landing pad and the second landing pad, and on the first bit line spacer, and contacting the recess portion of the bit line capping pattern of the bit line structure,
wherein the first bit line spacer includes the one first spacer that is disposed on the first side of the bit line structure, and the one second spacer that is disposed on the one first spacer,
a top surface of the one first spacer of the first bit line spacer is higher than a top surface of the one second spacer of the first bit line spacer,
the second bit line spacer includes the other one first spacer that is disposed on the second side of the bit line structure, and the other one second spacer that is disposed on the other one first spacer,
a top surface of the other one first spacer of the second bit line spacer is higher than a top surface of the other one second spacer of the second bit line spacer,
the insulation pattern includes a first upper buried dielectric pattern, a second upper buried dielectric pattern that is disposed on the first upper buried dielectric pattern, and a third upper buried dielectric pattern that is disposed on the second upper buried dielectric pattern,
the first upper buried dielectric pattern of the insulation pattern includes silicon nitride,
the second upper buried dielectric pattern of the insulation pattern includes silicon carbon nitride, and
the third upper buried dielectric pattern of the insulation pattern includes silicon nitride.

13. The semiconductor memory device of claim 12, wherein top surfaces of at least two of the first upper buried dielectric pattern, the second upper buried dielectric pattern, or the third upper buried dielectric pattern are substantially coplanar with each other.

14. The semiconductor memory device of claim 12, wherein a top surface of the insulation pattern is substantially coplanar with a top surface of at least one of the first landing pad or the second landing pad.

15. The semiconductor memory device of claim 12, wherein a top surface of at least one of the first landing pad or the second landing pad is substantially coplanar with a top surface of at least one of the first upper buried dielectric pattern, the second upper buried dielectric pattern, or the third upper buried dielectric pattern of the insulation pattern.

16. The semiconductor memory device of claim 12, wherein the top surface of the other one first spacer of the second bit line spacer is higher than the top surface of the one first spacer of the first bit line spacer.

17. The semiconductor memory device of claim 12, wherein the insulation pattern contacts the recess portion of the bit line capping pattern of the bit line structure, the first landing pad, and the second landing pad.

18. A semiconductor memory device comprising:
a substrate including a first impurity region and two second impurity regions, with the first impurity region disposed between a first second impurity region and a second second impurity region of the two second impurity regions;
a bit line structure electrically connected to the first impurity region of the substrate, the bit line structure including a bit line and a bit line capping pattern that is disposed on the bit line, the bit line capping pattern including a recess portion;
a first contact electrically connected to the first second impurity region of the substrate and disposed adjacent to a first side of the bit line structure;
a second contact electrically connected to the second second impurity region of the substrate and disposed adjacent to a second side of the bit line structure that is opposite to the first side of the bit line structure;
a first bit line spacer, which is constituted by one first spacer, one second spacer and a first air gap region, disposed between the first contact and the first side of the bit line structure;
a second bit line spacer, which is constituted by an other one first spacer, an other one second spacer and a second air gap region, disposed between the second contact and the second side of the bit line structure;
a first landing pad disposed on the first contact;
a second landing pad disposed on the second contact, and extending on the second bit line spacer and on a top surface of the bit line capping pattern; and
an insulation pattern disposed between the first landing pad and the second landing pad, and on the first bit line spacer, and contacting the recess portion of the bit line capping pattern of the bit line structure,
wherein the first bit line spacer includes the one first spacer that is disposed on the first side of the bit line structure, and the one second spacer that is disposed on the one first spacer,
a top surface of the one first spacer of the first bit line spacer is higher than a top surface of the one second spacer of the first bit line spacer,
the second bit line spacer includes the other one first spacer that is disposed on the second side of the bit line structure, and the other one second spacer that is disposed on the other one first spacer,
a top surface of the other one first spacer of the second bit line spacer is higher than a top surface of the other one second spacer of the second bit line spacer,
the insulation pattern includes a first upper buried dielectric pattern and a second upper buried dielectric pattern that is disposed on the first upper buried dielectric pattern, and
a top surface of at least one of the first landing pad or the second landing pad is substantially coplanar with a top surface of at least one of the first upper buried dielectric pattern or the second upper buried dielectric pattern of the insulation pattern.

19. The semiconductor memory device of claim 18, wherein the first bit line spacer includes the first air gap region that is disposed between the one first spacer and the one second spacer of the first bit line spacer, and
the second bit line spacer includes the second air gap region that is disposed between the other one first spacer and the other one second spacer of the second bit line spacer.

20. The semiconductor memory device of claim 18, wherein the first upper buried dielectric pattern of the insulation pattern includes silicon carbon nitride, and the second upper buried dielectric pattern of the insulation pattern includes silicon nitride.

* * * * *